(12) United States Patent
Choi

(10) Patent No.: US 11,875,050 B2
(45) Date of Patent: Jan. 16, 2024

(54) MEMORY DEVICE

(71) Applicant: SK hynix Inc., Icheon-si (KR)

(72) Inventor: Hyung Jin Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 91 days.

(21) Appl. No.: 17/525,459

(22) Filed: Nov. 12, 2021

(65) Prior Publication Data

US 2022/0229558 A1 Jul. 21, 2022

(30) Foreign Application Priority Data

Jan. 19, 2021 (KR) .................... 10-2021-0007384

(51) Int. Cl.
*G06F 3/00* (2006.01)
*G06F 3/06* (2006.01)

(52) U.S. Cl.
CPC ............ *G06F 3/064* (2013.01); *G06F 3/0604* (2013.01); *G06F 3/0656* (2013.01); *G06F 3/0679* (2013.01)

(58) Field of Classification Search
None
See application file for complete search history.

(56) References Cited

U.S. PATENT DOCUMENTS 10,580,514 B2 3/2020 Wu et al.
2015/0286567 A1* 10/2015 Park .................. G06F 11/00
711/143

FOREIGN PATENT DOCUMENTS

JP 2011522351 A * 7/2011
KR 1020190002358 A 1/2019
KR 1020210081073 A 7/2021

* cited by examiner

*Primary Examiner* — Midys Rojas
(74) *Attorney, Agent, or Firm* — William Park & Associates Ltd.

(57) ABSTRACT

Provided herein is a memory device including a memory block with memory cells to which word lines and bit lines are connected; page buffers, connected to the memory block through the bit lines, during a program operation, configured to convert original data that is received from an external device into variable data that is divided into groups according to a number of specific data, and configured to apply a program enable voltage or a program inhibit voltage to the bit lines according to the variable data; and a data pattern manager configured to control the page buffers to convert the original data into the variable data during the program operation.

19 Claims, 15 Drawing Sheets

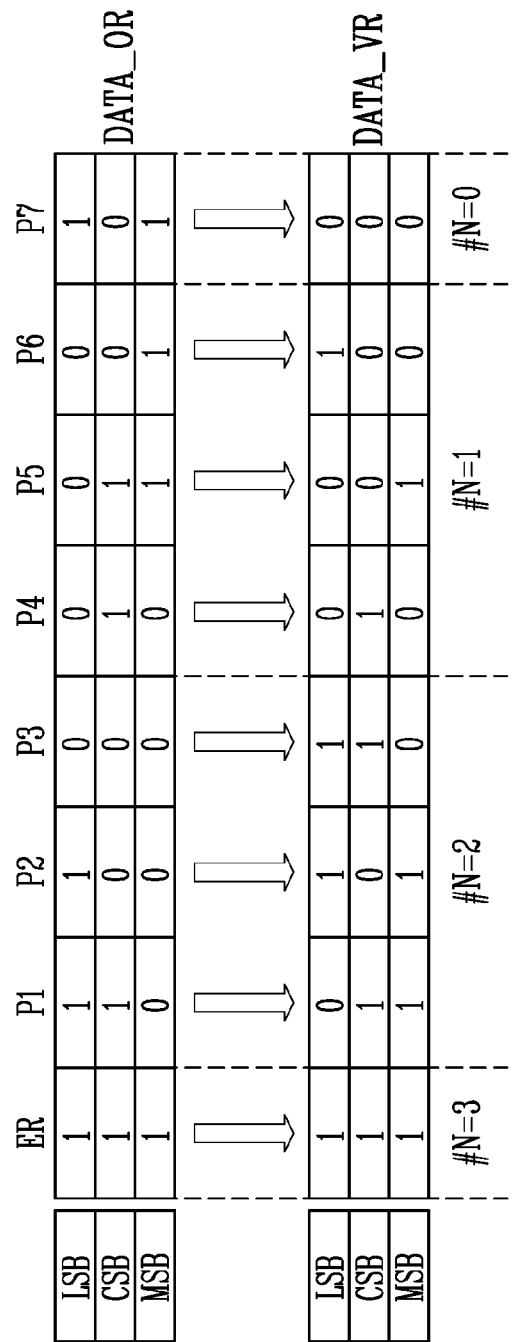

MEMORY DEVICE

CROSS-REFERENCE TO RELATED APPLICATION

The present application claims priority under 35 U.S.C. § 119(a) to Korean patent application number 10-2021-0007384, filed on Jan. 19, 2021, which is incorporated herein by reference in its entirety.

BACKGROUND

1. Technical Field

Various embodiment of the present disclosure relate to a memory device, and more particularly, to a memory device capable of performing a program operation.

2. Related Art

A memory device may include a volatile memory device in which data that is stored therein is lost when power supply is interrupted, and a non-volatile memory device in which data that is stored therein is maintained even when power supply is interrupted.

The volatile memory device may include a dynamic random-access memory (DRAM) and a static random-access memory (SRAM). The non-volatile memory device may include a read only memory (ROM), a programmable read only memory (PROM), an erasable PROM (EPROM), an Electrically EPROM (EEPROM), a NAND FLASH, etc.

The memory device may include a memory cell array, a peripheral circuit, and a control logic circuit.

The memory cell array may include a plurality of memory blocks, and each of the plurality of memory blocks may include a plurality of memory cells capable of storing data. The peripheral circuit may be configured to perform a program, read, or erase operation based on the control logic circuit. The control logic circuit may be configured to control the peripheral circuit according to a program, read, or erase algorithm in response to an input command.

SUMMARY

An embodiment of the present disclosure may provide for a memory device including a memory block including memory cells to which word lines and bit lines are connected; page buffers, connected to the memory block through the bit lines, during a program operation, configured to convert original data that is received from an external device into variable data that is divided into groups according to a number of specific data, and configured to apply a program enable voltage or a program inhibit voltage to the bit lines according to the variable data; and a data pattern manager configured to control the page buffers to convert the original data into the variable data during the program operation.

An embodiment of the present disclosure may provide for a memory device including a page buffer with a plurality of latches, the page buffer configured to store first logic page data, second logic page data, and third logic page data in a portion of the latches, respectively; and a data pattern manager configured to control the page buffer to convert original data into variable data by moving the first to third logic page data of the original data between the latches, wherein, when the original data is converted into the variable data, the data pattern manager is configured to control the page buffer to generate the variable data with data combinations that are divided into a plurality of groups according to a number of specific data that is included in the first to third logic page data.

An embodiment of the present disclosure may provide for a memory device including memory cells programmed into various states according to a combination of N-bit data; a peripheral circuit configured to receive original data to perform a program operation of the memory cells, and to convert the original data into variable data that is divided into first to N+1-th groups according to a number of specific data; and a control logic circuit configured to control the peripheral circuit to convert the original data into the variable data and configured to control the peripheral circuit to program the memory cells by using the variable data.

BRIEF DESCRIPTION OF THE DRAWINGS

FIGS. 9A and 9B are diagrams illustrating various embodiments of converted data in accordance with the first embodiment of the present disclosure.

DETAILED DESCRIPTION

Various embodiments of the present disclosure are directed to a memory device, capable of converting original data that is input into the memory device into variable data divided according to a given rule during a program operation.

Figure 1:
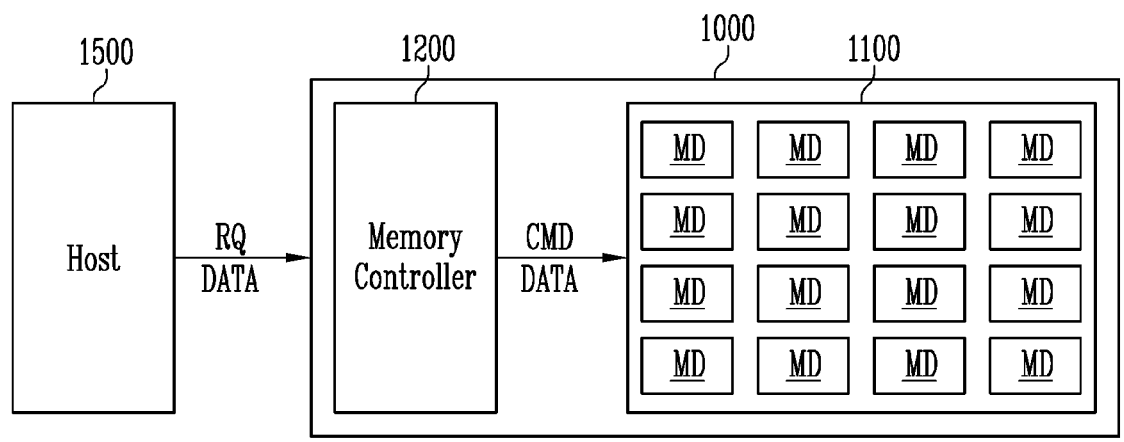
FIG. 1 is a diagram illustrating a memory system in accordance with the present disclosure.

FIG. 1 is a diagram illustrating a memory system in accordance with the present disclosure.

Referring to FIG. 1, the memory system 1000 may include a storage device 1100 and a memory controller 1200. The storage device 1100 may include a plurality of memory devices MD, and the memory devices MD may be connected to the memory controller 1200 through channels.

The controller 1200 may communicate between a host 1500 and the memory devices MD. The memory controller 1200 may generate a command CMD to control the memory devices MD in response to a request RQ from the host 1500 and may perform a background operation to improve the performance of the memory system 1000 even if there is no request RQ from the host 1500. For example, if the host 1500 transmits the request RQ and data DATA for a program operation to the memory system 1000, the memory controller 1200 may convert the received request RQ into the command CMD and transmit the command CMD and the data DATA to the storage device 1100. The memory device MD that is selected among the memory devices MD that are included in the storage device 1100 may receive the command CMD and the data DATA that are output from the memory controller 1200 and may program the data DATA in response to the command CMD.

The memory device MD may convert the original data DATA that is received from the memory controller 1200 and then program the converted data. The memory device MD configured to convert the data and program the converted data will be described with reference to following drawings.

The host 1500 may generate the requests RQ for various operations and output the generated requests RQ to the memory system 1000. For example, the requests RQ may include a program request for controlling a program operation, a read request for controlling a read operation, and an erase request for controlling an erase operation.

The host 1500 may communicate with the memory system 1000 through various interfaces, such as a peripheral component interconnect express (PCIe) interface, an advanced technology attachment (ATA) interface, a serial ATA (SATA) interface, a parallel ATA (PATA) interface, a serial attached SCSI (SAS) interface, a non-volatile memory express (NVMe) interface, a universal serial bus (USB) interface, a multi-media card (MMC) interface, an enhanced small disk interface (ESDI), or an integrated drive electronics (IDE) interface.

Figure 2:
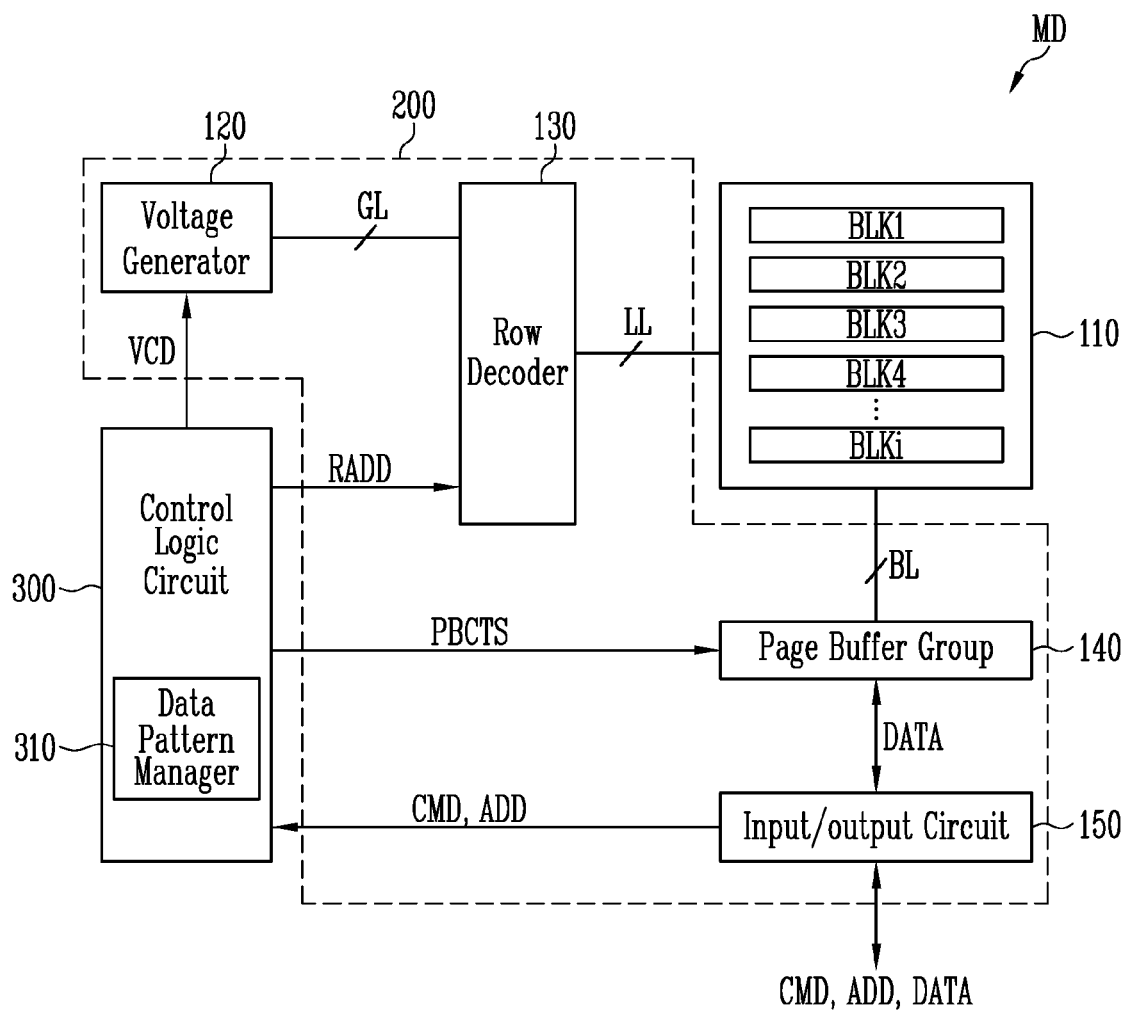
FIG. 2 is a diagram illustrating a memory device in accordance with the present disclosure.

FIG. 2 is a diagram illustrating a memory device in accordance with the present disclosure.

Referring to FIG. 2, the memory device MD may include a memory cell array 110 in which data is stored, a peripheral circuit 200 that performs a program, read or erase operation, and a control logic circuit 300 that controls the peripheral circuit 200.

The memory cell array 110 may include a plurality of memory blocks BLK1 to BLKi. Each of the memory blocks BLK1 to BLKi (i is a positive integer) may include a plurality of memory cells, and the memory cells may be implemented as a two-dimensional structure that is arranged to be parallel to a substrate or a three-dimensional structure stacked that is perpendicular to the substrate.

The peripheral circuit 200 may include a voltage generator 120, a row decoder 130, a page buffer group 140, and an input/output circuit 150.

The voltage generator 120 may generate operating voltages that are required for various operations in response to a voltage code VCD and may output the operating voltages through global lines GL. For example, the voltage generator 120 may generate a program voltage, a verification voltage, a read voltage, a pass voltage, an erase voltage, etc. in response to the voltage code VCD, and may output the generated operating voltages through the global lines GL.

The row decoder 130 may select one memory block from among the memory blocks BLK1 to BLKi that are included in the memory cell array 110 according to a row address RADD and may transmit operating voltages through local lines LL that are connected to the selected memory block. For example, the row decoder 130 may receive operating voltages through the global lines GL and may transmit the operating voltages to the selected memory block through the selected local lines LL in response to the row address RADD.

The page buffer group 140 may be connected to the memory cell array 110 through the bit lines BL. For example, the page buffer group 140 may include a plurality of page buffers that are connected to the bit lines BL, respectively. The plurality of page buffers may be simultaneously operated in response to the page buffer control signals PBCTS and may temporarily store data during a program or read operation. After the page buffer group 140 stores the original data that is received from the input/output circuit 150 during the program operation, the page buffer group may generate variable data by converting the original data, according to a given rule, in response to the page buffer control signals PBCTS. If the variable data is generated, the variable data, instead of the original data, may be stored in the page buffer group 140. The memory device MD may perform the program operation by using the variable data.

The input/output circuit 150 may be connected to the memory controller 1200 (see FIG. 1) through the input/output lines. The input/output circuit 150 may input and output the command CMD, an address ADD, and the data DATA through the input/output lines. For example, the input/output circuit 150 may transmit the command CMD and the address ADD, received through the input/output lines, to the control logic circuit 300, and may transmit the data DATA, received from the memory controller 1200 through the input/output lines, to the page buffer group 140 during the program operation. The data DATA that is transmitted by the input/output circuit 150 may be the original data.

The control logic circuit 300 may output the voltage code VCD, the row address RADD, and the page buffer control signals PBCTS in response to the command CMD and the address ADD. For example, the control logic circuit 300 may include software configured to perform an algorithm in response to the command CMD and hardware configured to output various signals according to the address ADD and the algorithm. Further, the control logic circuit 300 may include a data pattern manager 310 configured to convert the original data that is input into the page buffer group 140 into variable data during the program operation.

The data pattern manager 310 may be configured to convert original data into variable data according to the given rule. For instance, the data pattern manager 310 may divide target program states of the memory cells into a plurality of groups according to the number of specific data and may convert the original data into variable data so that the number of specific data that is included in the variable data is the same within each group. In other words, the number of specific data may be variously set in the original data, regardless of the target program states, but the number of specific data may be set to be constant in the variable data, according to the present embodiment, based on the group of target program states. The specific data may be selected from 0 or 1. In this embodiment, a case in which 1 is set as specific data will be described.

Figure 3:
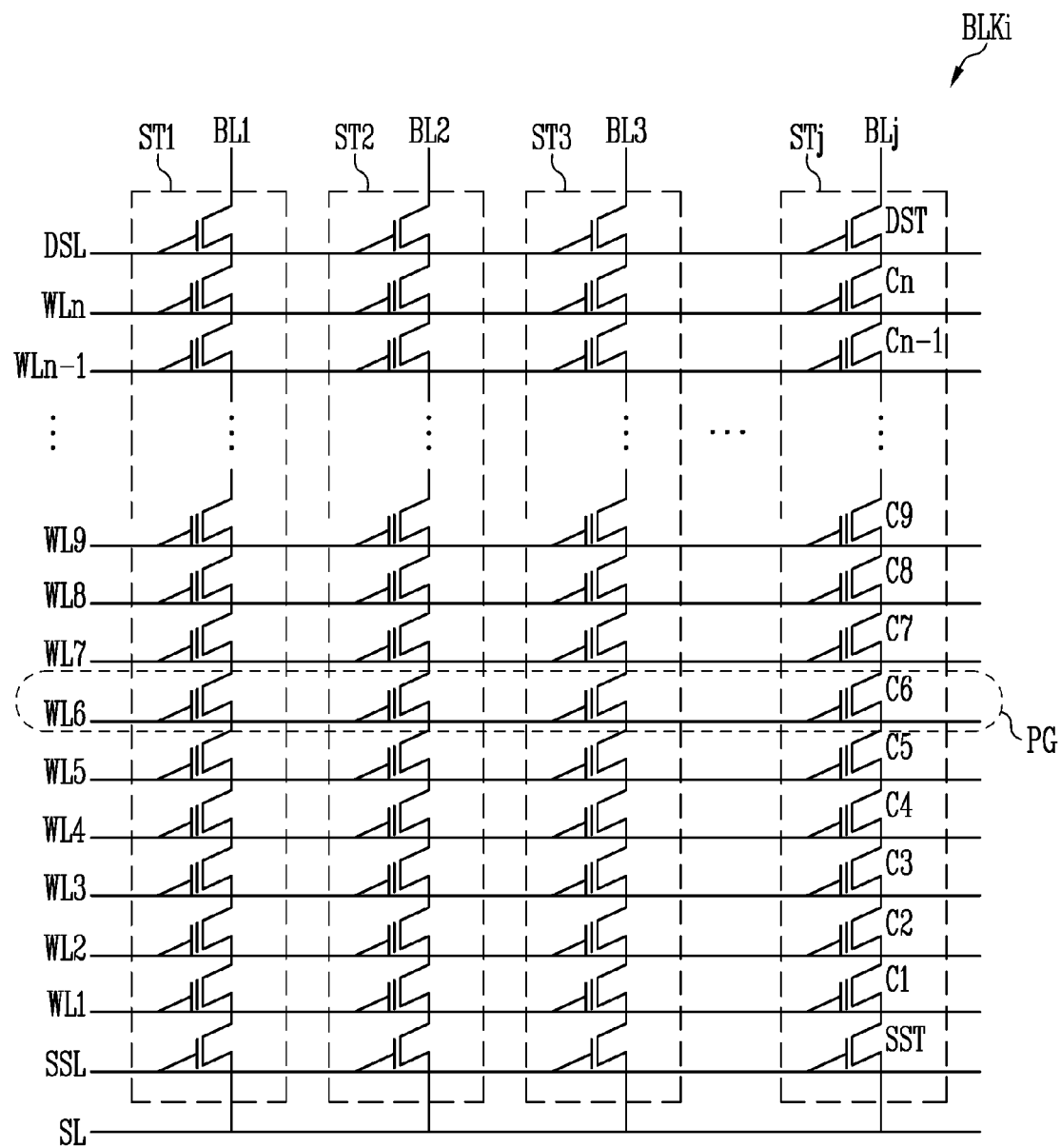
FIG. 3 is a diagram illustrating a memory block in accordance with the present disclosure.

FIG. 3 is a diagram illustrating a memory block in accordance with the present disclosure, and an i-th memory block BLKi among a plurality of memory blocks BLK1 to BLKi, shown in FIG. 2, is illustrated as an example.

Referring to FIG. 3, the i-th memory block BLKi may include a plurality of strings ST1 to STj, j being a positive integer. The first to j-th strings ST1 to STj may be connected between the first to j-th bit lines BL1 to BLj and a source line SL. For instance, the first string ST1 may be connected between the first bit line BL1 and the source line SL, the second string ST2 may be connected between the second bit line BL2 and the source line SL, and the j-th string STj may be connected between the j-th bit line BLj and the source line SL.

Each of the first to j-th strings ST1 to STj may include a source select transistor SST, a plurality of memory cells C1 to Cn, and a drain select transistor DST. Although not shown in the drawing, dummy cells may be further included between the memory cells C1 to Cn and the source or drain select transistors SST or DST. The configuration of the string may be described in detail by using the j-th string STj as an example.

Gates of the source select transistors SST that are included in the different strings ST1 to STj may be connected in common to the source select line SSL, and gates of the first to n-th memory cells C1 to Cn may be connected to first to n-th word lines WL1 to WLn, and gates of the drain select transistors DST may be connected in common to the drain select line DSL. For instance, the source select transistor SST that is included in the j-th string STj may electrically connect or disconnect the source line SL and the first memory cell C1 to or from each other according to a voltage that is applied to the source select line SSL. Variable data may be stored in the first to n-th memory cells C1 to Cn. The drain select transistor DST may electrically connect or disconnect the j-th bit line BLj and the n-th memory cell Cn to or from each other according to a voltage that is applied to the drain select line DSL. A group of memory cells that is connected to the same word line is referred to as a page PG, and program and read operations may be performed on the basis of the page PG.

The memory cells C1 to Cn may store data that has at least one bit according to a program method. For instance, a method in which 1-bit data is stored in one memory cell is referred to as a single level cell method, and a method in which 2-bit data is stored in one memory cell is referred to as a multi level cell method. A method in which 3-bit data is stored in one memory cell is referred to as a triple level cell method, and a method in which 4-bit data is stored in one memory cell is referred to as a quadruple level cell method In addition, data of 5 bits or more may be stored in one memory cell.

The read operation may be performed in the same manner as the program operation. For example, if the memory cells included in the selected memory block are programmed in the triple level cell method, the read operation may also be performed in the triple level cell method.

Figure 4:
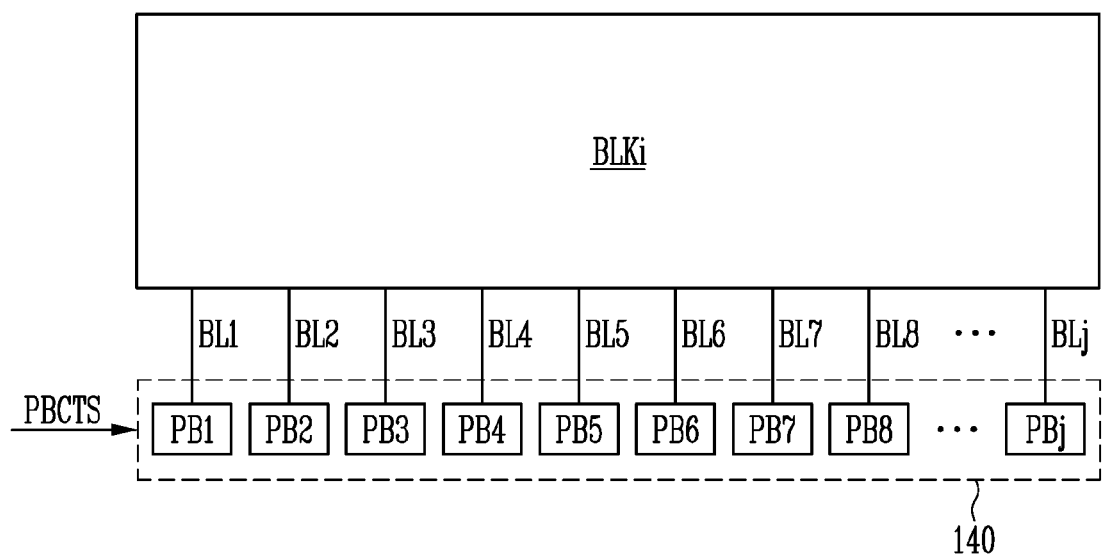
FIG. 4 is a diagram illustrating a page buffer group in accordance with the present disclosure.

FIG. 4 is a diagram illustrating a page buffer group in accordance with the present disclosure.

Referring to FIG. 4, the page buffer group 140 may include first to j-th page buffers PB1 to PBj that are connected, respectively, to the first to j-th bit lines BL1 to BLj. The first to j-th page buffers PB1 to PBj may simultaneously operate in response to page buffer control signals PBCTS. During the program operation, the first to j-th page buffers PB1 to PBj may be configured to temporarily store original data that is output from the input/output circuit 150 (see FIG. 2) and convert the original data into the variable data in response to the page buffer control signals PBCTS. The first to j-th page buffers PB1 to PBj may apply a program enable voltage or a program inhibit voltage to the first to j-th bit lines BL1 to BLj according to the variable data. When voltages are supplied to the first to j-th bit lines BL1 to BLj and the program voltage is applied to a selected page that is included in the i-th memory block BLKi, the memory cells that are included in the selected page may be programmed.

Since the first to j-th page buffers PB1 to PBj are configured identically to each other, the configuration of the page buffer will be described below in detail by using the first page buffer PB1 as an example.

Figure 5:
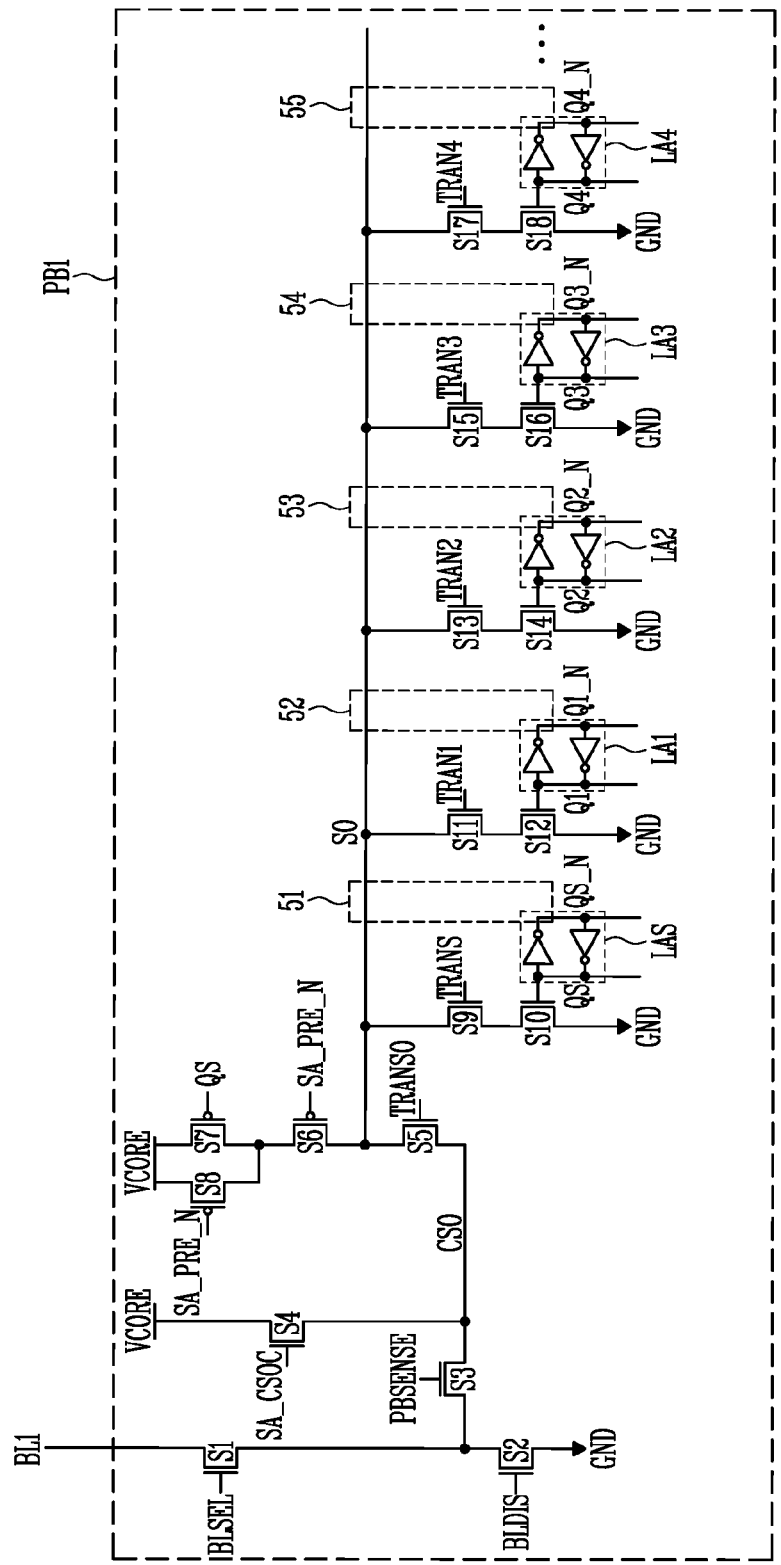
FIG. 5 is a diagram illustrating a page buffer in accordance with an embodiment of the present disclosure.

FIG. 5 is a diagram illustrating a page buffer in accordance with an embodiment of the present disclosure.

Referring to FIG. 5, the first page buffer PB1 may include first to eighteenth switches S1 to S18, a sensing latch LAS, and first to fourth latches LA1 to LA4. Since circuits that are required for this embodiment are shown in the first page buffer PB1, shown in FIG. 5, circuits (not shown) performing various functions as well as the circuits shown in FIG. 5 may be further included. Signals that control the first to eighteenth switches S1 to S18 are included in the page buffer control signals PBCTS (see FIG. 2). In other words, the first to eighteenth switches S1 to S18 may operate in response to the page buffer control signals PBCTS (see FIG. 2), respectively.

Each of the switches and latches, shown, in FIG. 5 will be described below in detail.

The first switch S1 may be implemented as an NMOS transistor that may electrically connect the first bit line BL1 and the second switch S2 in response to a bit line select signal BLSEL. The second switch S2 may be connected between the first switch S1 and a ground terminal GND and may be implemented as the NMOS transistor that may discharge a node between the first switch S1 and the second switch S2 in response to a bit line discharge signal BLDIS. For example, the first switch S1 may be turned on when a voltage is applied to the first bit line BL1 in the first page buffer PB1, when a voltage or current of the first bit line BL1 is sensed, or when first bit line BL1 is discharged. The second switch S2 may be turned on when the first bit line BL1 is discharged.

The third switch S3 may be connected between a node connecting the first and second switches S1 and S2 and a current sensing node CSO and may be implemented as an NMOS transistor that is turned on in response to the page buffer sensing signal PBSENSE. The third switch S3 may be turned on when a voltage is transmitted to the first bit line BL1 in the first page buffer PB1 or when a voltage or current of the first bit line BL1 is sensed. The fourth switch S4 may be connected between a supply voltage terminal VCORE and a current sensing node CSO and may be implemented as an NMOS transistor that may be turned on in response to a current sensing node control signal SA_CSOC. The third and fourth switches S3 and S4 may be turned on when a voltage is applied to the first bit line BL1 in the first page buffer PB1 or when a current of the first bit line BL1 is kept constant.

The fifth switch S5 may be connected between the current sensing node CSO and a sensing node SO and may be implemented as an NMOS transistor that may be turned on in response to a sensing node transmission signal TRANSO. The fifth switch S5 may be turned on when a voltage of the sensing node SO is transmitted to the current sensing node CSO, when the current sensing node CSO is pre-charged, and when a voltage or current of the current sensing node CSO is transmitted to the sensing node SO. The sixth switch S6 may be connected between the seventh switch S7 and the sensing node SO and may be implemented as a PMOS transistor that may be turned on in response to an inverted pre-charge signal SA_PRE_N. The seventh switch S7 may be connected between the supply voltage terminal VCORE and the sixth switch S6 and may be implemented as a PMOS transistor that may be turned on or turned off according to data that is stored in the data sensing node QS. The eighth switch S8 may be implemented as a PMOS transistor that may transmit a supply voltage that is supplied to the supply voltage terminal VCORE in response to the inverted pre-charge signal SA_PRE_N to a node between the sixth and seventh switches S6 and S7.

A plurality of latches LAS, LA1, LA2, LA3, and LA4 may be connected to the sensing node SO through a plurality of switches S9 to S18. For example, the sensing latch LAS may be connected to the sensing node SO through the ninth and tenth switches S19 and S10, the first latch LA1 may be connected to the sensing node SO through the 11-th and 12-th switches S11 and S12, the second latch LA2 may be connected to the sensing node SO through the 13-th and 14-th switches S13 and S14, the third latch LA3 may be connected to the sensing node SO through the 15th and 16-th switches S15 and S16, and the fourth latch LA4 may be connected to the sensing node SO through the 17-th and 18-th switches S17 and S18. In addition, more latches may be connected to the sensing node SO. The plurality of latches LAS, LA1, LA2, LA3 and LA4 and the plurality of switches S9 to S18 shown in FIG. 5 will be described below in detail.

The ninth and tenth switches S9 and S10 may be connected between the sensing node SO and the ground terminal GND, and the sensing latch LAS may be connected to the gate of the tenth switch S10. The ninth switch S9 may be implemented as an NMOS transistor that connects the sensing node SO and the tenth switch S10 in response to the sensing transmission signal TRANS. The tenth switch S10 may be implemented as an NMOS transistor that connects or disconnects the ninth switch S9 and the ground terminal GND according to data that is stored in the data sensing node QS of the sensing latch LAS.

The sensing latch LAS may include inverters that are connected between the data sensing node QS and an inverted data sensing node QS_N in which different data is stored. Conventionally, transistors configured to connect or disconnect the sensing node SO and the inverted data sensing node QS_N are included in an area 51 between the sensing node SO and the inverted data sensing node QS_N. However, according to the present embodiment, transistors that are formed in the corresponding area 51 may be removed so as to reduce the size of the memory device.

The 11-th and 12-th switches S11 and S12 may be connected between the sensing node SO and the ground terminal GND, and the first latch LA1 may be connected to a gate of the 12-th switch S12. The 11-th switch S11 may be implemented as an NMOS transistor that connects the sensing node SO and the 12-th switch S12 in response to a first transmission signal TRAN1. The 12-th switch S12 may be implemented as an NMOS transistor that connects or disconnects the 11-th switch S11 and the ground terminal GND according to data that is stored in the first node Q1 of the first latch LA1.

The first latch LA1 may include inverters that are connected between the first node Q1 in which different data is stored and a first inverted node Q1_N. Conventionally, transistors configured to connect or disconnect the sensing node SO and the first inverted node Q1_N are included in an area 52 between the sensing node SO and the first inverted node Q1_N. However, according to the present embodiment, transistors that are formed in the corresponding area 52 may be removed so as to reduce the size of the memory device.

The 13-th and 14-th switches S13 and S14 may be connected between the sensing node SO and the ground terminal GND, and the second latch LA2 may be connected to a gate of the 14-th switch S14. The 13-th switch S13 may be implemented as an NMOS transistor that connects the sensing node SO and the 14-th switch S14 in response to a second transmission signal TRAN2. The 14-th switch S14 may be implemented as an NMOS transistor that connects or disconnects the 13-th switch S13 and the ground terminal GND according to data that is stored in the second node Q2 of the second latch LA2.

The second latch LA2 may include inverters that are connected between the second node Q2 and a second inverted node Q2_N in which different data is stored. Conventionally, transistors configured to connect or disconnect the sensing node SO and the second inverted node Q2_N are included in an area 53 between the sensing node SO and the second inverted node Q2_N. However, according to the present embodiment, transistors that are formed in the corresponding area 53 may be removed so as to reduce the size of the memory device.

The 15-th and 16-th switches S15 and S16 may be connected between the sensing node SO and the ground terminal GND, and the third latch LA3 may be connected to a gate of the 16-th switch S16. The 15-th switch S15 may be implemented as an NMOS transistor that connects the sensing node SO and the 16-th switch S16 in response to a third transmission signal TRAN3. The 16-th switch S16 may be implemented as an NMOS transistor that connects or disconnects the 15-th switch S15 and the ground terminal GND according to data that is stored in the third node Q3 of the third latch LA3.

The third latch LA3 may include inverters that are connected between the third node Q3 and a third inverted node Q3_N in which different data is stored. Conventionally, transistors configured to connect or disconnect the sensing node SO and the third inverted node Q3_N are included in an area 54 between the sensing node SO and the third inverted node Q3_N. However, according to the present embodiment, transistors that are formed in the corresponding area 54 may be removed so as to reduce the size of the memory device.

The 17-th and 18-th switches S17 and S18 may be connected between the sensing node SO and the ground terminal GND, and the fourth latch LA4 may be connected to a gate of the 18-th switch S18. The 17-th switch S17 may be implemented as an NMOS transistor that connects the sensing node SO and the 18-th switch S18 in response to a fourth transmission signal TRAN4. The 18-th switch S18 may be implemented as an NMOS transistor that connects or disconnects the 17-th switch S17 and the ground terminal GND according to data that is stored in the fourth node Q4 of the fourth latch LA4.

The fourth latch LA4 may include inverters that are connected between the fourth node Q4 and a fourth inverted node Q4_N in which different data is stored. Conventionally, transistors configured to connect or disconnect the sensing node SO and the fourth inverted node Q4_N are included in an area 55 between the sensing node SO and the fourth inverted node Q4_N. However, according to the present embodiment, transistors that are formed in the corresponding area 55 may be removed so as to reduce the size of the memory device.

During the program operation, the first page buffer PB1 may temporarily store the original data that is received from an external device in the first to third latches LA1 to LA3, and may convert the original data that is stored in the first to third latches LA1 to LA3 into variable data. To this end, the first page buffer PB1 includes latches, the number of which is at least one more than the number of logic page data. For example, in the triple level cell method, the logic page data may include a least significant bit (LSB) data, a central significant bit (CSB) data, and a most significant bit (MSB) data. Since three pieces of logic page data are used in the triple level cell method, the first page buffer PB1 may be configured to include four or more latches.

The remaining page buffers that are not shown in FIG. 5 may also be configured in the same manner as the first page buffer PB1 and may be operated in the same manner as the first page buffer PB1. Since pieces of original data that is stored in the latches of the page buffers are different from each other even if the page buffers are operated in the same manner, pieces of variable data that are converted in the page buffers may also be different from each other.

Figure 6:
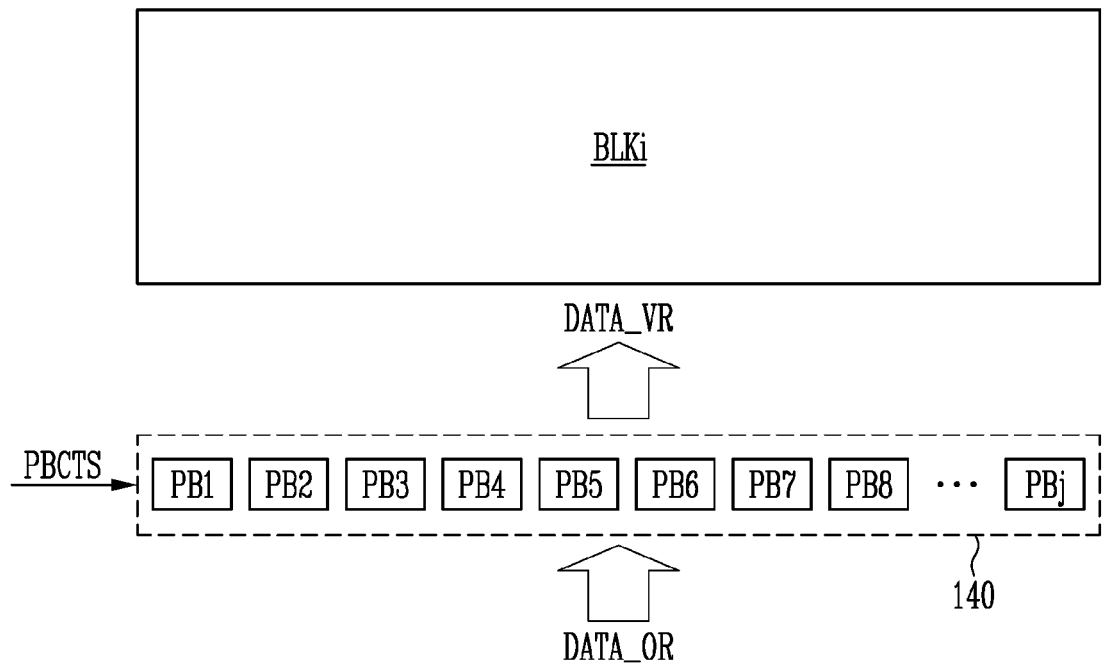
FIG. 6 is a diagram illustrating a program operation in accordance with the present disclosure.

FIG. 6 is a diagram illustrating a program operation in accordance with the present disclosure.

Referring to FIG. 6, when the program operation of the i-th memory block BLKi is performed, the first to j-th page buffers PB1 to PBj that are included in the page buffer group 140 may receive original data DATA_OR in response to the page buffer control signals PBCTS and may convert the original data DATA_OR into the variable data DATA_VR according to a given rule. The first to j-th page buffers PB1 to PBj may program a selected page of the i-th memory block BLKi by using the variable data DATA_VR. Steps of the program operation in accordance with this embodiment will be described as follows.

Figure 7A:
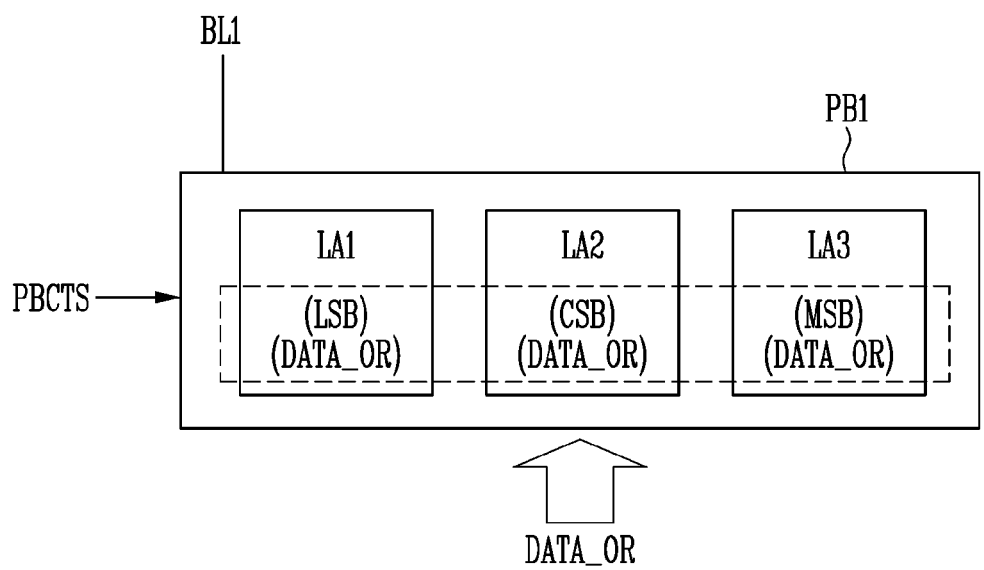
FIGS. 7A to 7C are diagrams illustrating the operation of the page buffer in accordance with the present disclosure.
Figure 7B:
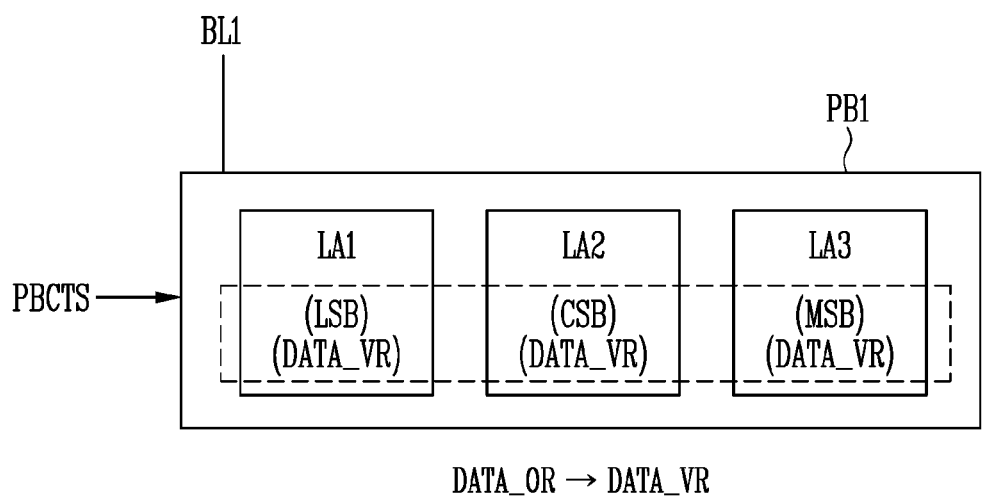
Figure 7C:
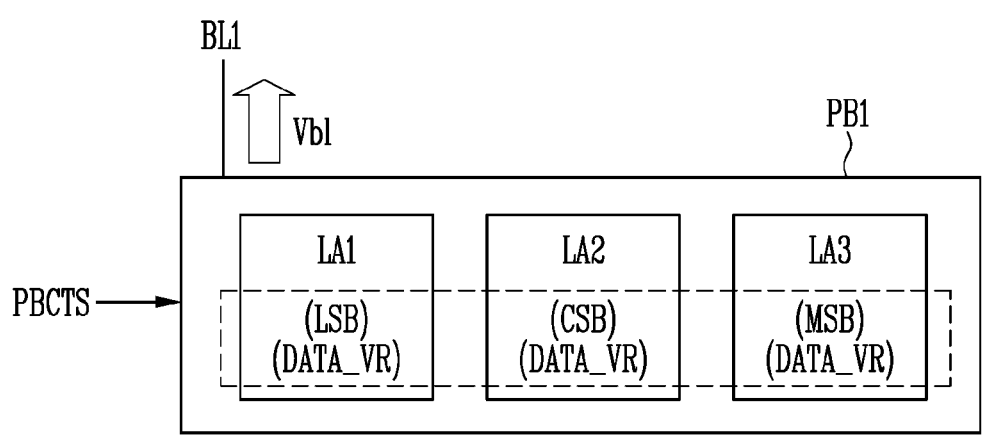

FIGS. 7A to 7C are diagrams illustrating the operation of the page buffer in accordance with the present disclosure, and the operation performed in the first page buffer PB1 will be described as an example.

Referring to FIG. 7A, if the program operation is started, original data DATA_OR including a least significant bit (LSB) data, a central significant bit (CSB) data, and a most significant bit (MSB) data may be input into the first page buffer PB1 in response to the page buffer control signals PBCTS. Here, the original data may be data that is received from an external device. The external device may be the memory controller 1200 (see FIG. 1).

Referring to FIG. 7B, the first page buffer PB1 may convert the original data DATA_OR into the variable data DATA_VR in response to the page buffer control signals PBCTS. The variable data DATA_VR may be stored in the first to third latches LA1 to LA3 in which the original data DATA_OR is stored, but may be stored in latches that are different from latches in which the original data DATA_OR is stored. FIG. 7B illustrates an embodiment in which the variable data DATA_VR is overwritten in the first to third latches LA1 to LA3 in which the original data DATA_OR is stored. In this embodiment, the variable data may have a pattern that is divided into a plurality of groups according to the number of specific data. For example, when data 1 among data 0 and 1 is set as specific data, the variable data may have a pattern that distinguishes the erase state and the seven program states from each other based on the number of data 1's are in the variable data.

Referring to FIG. 7C, the first page buffer PB1 may generate a bit line voltage Vbl based on the variable data DATA_VR that is stored in the first to third latches LA1 to LA3 in response to the page buffer control signals PBCTS and may apply the bit line voltage Vbl to the first bit line BL1. The bit line voltage Vbl may have a program inhibit voltage level or a program enable voltage level. For example, the program inhibit voltage level may be a positive voltage level, and the program enable voltage level may be 0V.

Figure 8:
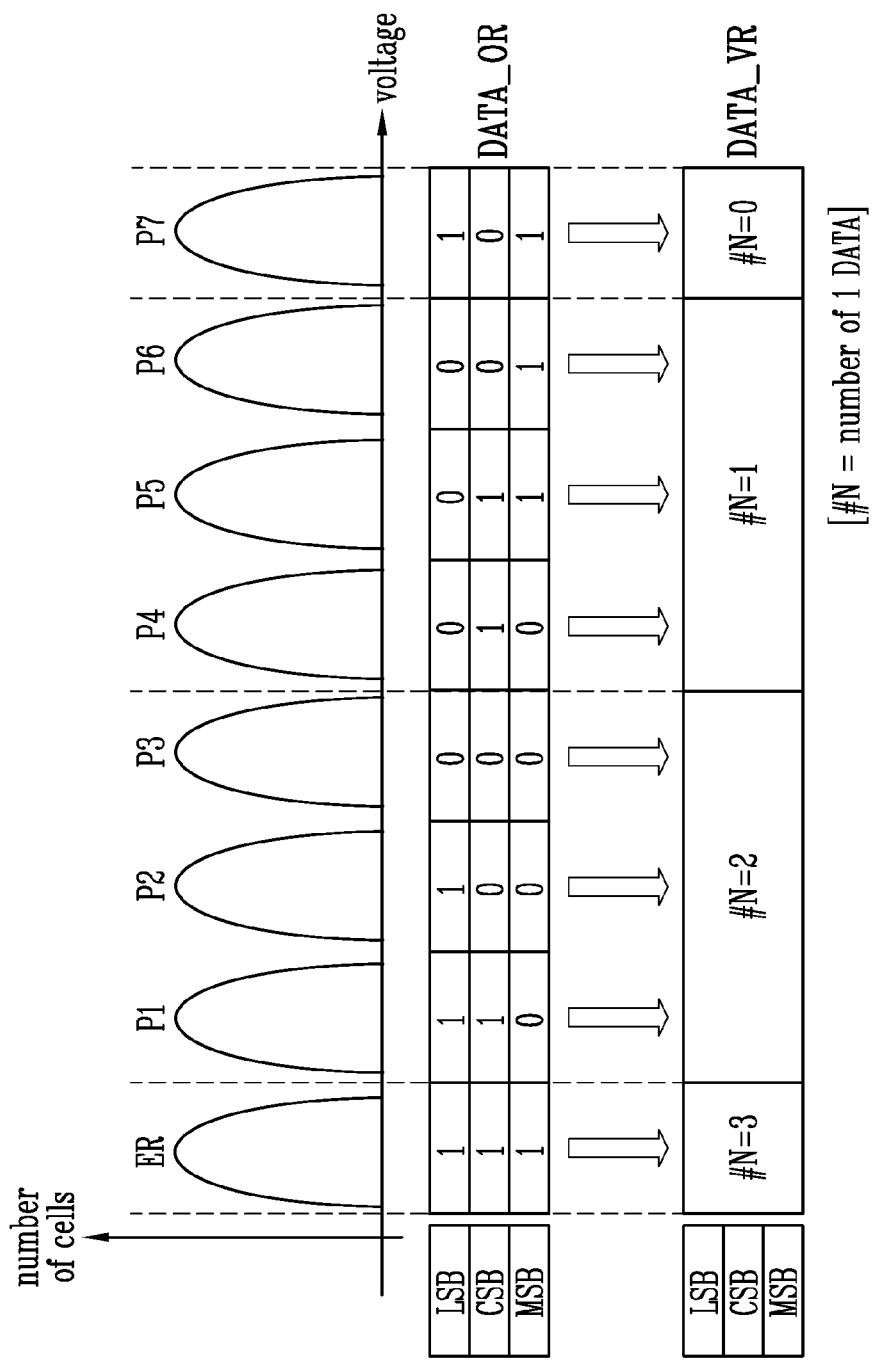
FIG. 8 is a diagram illustrating a data conversion method in accordance with a first embodiment of the present disclosure.

FIG. 8 is a diagram illustrating a data conversion method in accordance with a first embodiment of the present disclosure, in which the triple level cell method is shown as the first embodiment.

Referring to FIG. 8, in the triple level cell method, the state of memory cells may be divided into one erase state ER and first to seventh program states P1 to P7. In the erase state ER, the threshold voltage of the memory cells may be the lowest. From the first program state P1 to the seventh program state P7, the memory cells may have threshold voltages increased in stages. The state of the memory cells may be determined according to the combination of least significant bit (LSB) data, central significant bit (CSB) data, and most significant bit (MSB) data. For instance, in the original data DATA_OR, the erase state ER may be set to least significant bit (LSB) data of 1, central significant bit (CSB) data of 1, and most significant bit (MSB) data of 1. If the original data DATA_OR that is set in each of the first to seventh program states P1 to P7 is arranged in the order of LSB, CSB, and MSB, it may be 110, 100, 000, 010, 011, 001, and 101. The original data DATA_OR, shown in FIG. 8, may have any set pattern to help understand the present embodiment, and may be set to various patterns in addition to the pattern that is shown in FIG. 8.

However, since the original data DATA_OR that corresponds to each of the erase state ER and the first to seventh program states P1 to P7 is not set in a predetermined pattern, a large number of latches may be required for each of the page buffers to perform the program operation by using the original data DATA_OR.

Therefore, according to this embodiment, in order to minimize the number of latches that are included in the page buffer, the original data DATA_OR may be converted into variable data DATA_VR with a given rule. The operation of converting the original data DATA_OR into the variable data DATA_VR may be performed by the data pattern manager 310, illustrated in FIG. 2. Although FIG. 2 illustrates that the data pattern manager 310 is included in the control logic circuit 300 (see FIG. 2), the data pattern manager may be independently disposed outside of the control logic circuit 300 (see FIG. 2).

According to the given rule of this embodiment, the combination of the LSB data, the CSB data, and the MSB data may be divided into a plurality of groups according to the number of specific data, and states of memory cells may correspond to different data combinations that are included in each group. For example, the erase state ER may be set to the combination of the LSB data, the CSB data, and the MSB data in which the number (#N) of data 1's is three (3), the first to third program states P1 to P3 may be set to the combinations of the LSB data, the CSB data, and the MSB data in which the number (#N) of data 1's is two (2), the fourth to sixth program states P4 to P6 may be set to the combinations of the LSB data, the CSB data, and the MSB data in which the number (#N) of data 1's is one, and the seventh program state P7 may be set to the combination of the LSB data, the CSB data, and the MSB data in which the number (#N) of data 1's is zero (0).

In other words, in the original data DATA_OR, the number (#N) of data 1's that are included in the combinations of the LSB data, the CSB data, and the MSB data of the first to third program states P1 to P3 is 2, 1, and 0, and the number (#N) of data 1's that are included in the combinations of the LSB data, the CSB data, and the MSB data of the fourth to sixth program states P4 to P6 is 1, 2, and 1. Therefore, the original data DATA_OR might not adhere to a given rule.

However, the variable data DATA_VR that is converted according to the present embodiment may be set by a given rule in which the data combination that corresponds to the erase state ER to the seventh program state P7 is divided according to the number of data 1's. The variable data DATA_VR, in accordance with the first embodiment, will be described below in detail.

Figure 9A:
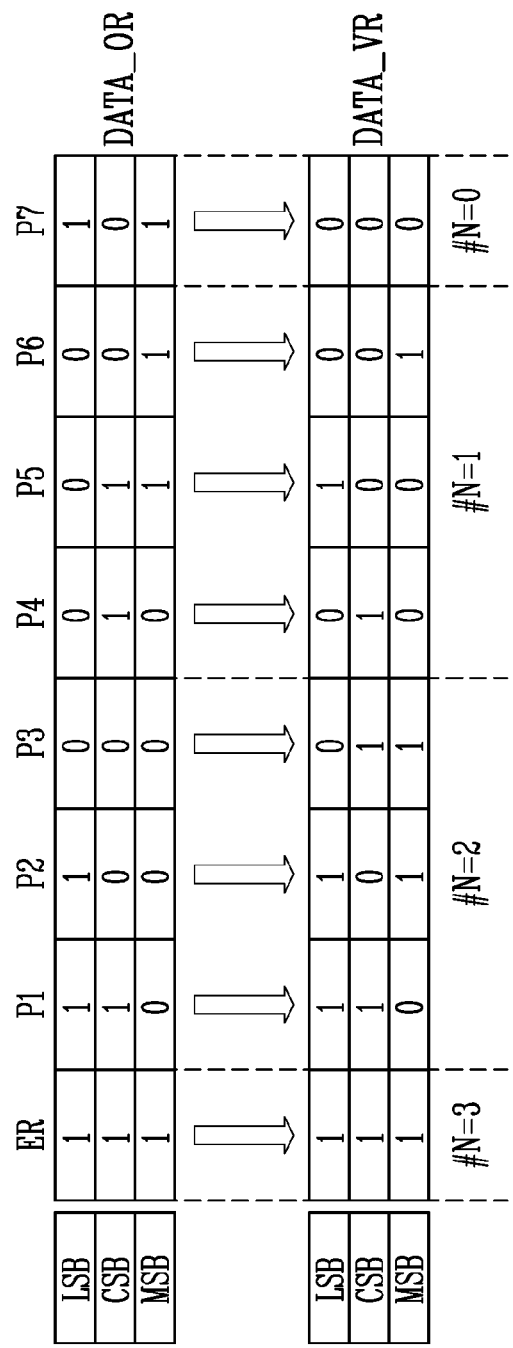

FIGS. 9A and 9B are diagrams illustrating various embodiments of converted data in accordance with the first embodiment of the present disclosure.

Referring to FIG. 9A, the erase state ER with the lowest threshold voltage may be set to the combination of the LSB data, the CSB data, and the MSB data in which the number (#N) of data 1's is three (3), the first to third program states P1 to P3 may be set to the combinations of the LSB data, the CSB data, and the MSB data in which the number (#N) of data 1's is two (2), the fourth to sixth program states P4 to P6 may be set to the combinations of the LSB data, the CSB data, and the MSB data in which the number (#N) of data 1's is one (1), and the seventh program state P7 with the highest threshold voltage may be set to the combination of the LSB data, the CSB data, and the MSB data in which the number (#N) of data 1's is zero (0).

For instance, the variable data DATA_VR that corresponds to the erase state ER may be set to 111 in the order of LSB, CSB, and MSB. The variable data DATA_VR that corresponds to the first to third program states P1 to P3 may be set to 110, 101, and 011 in the order of LSB, CSB, and MSB. The variable data DATA_VR that corresponds to the fourth to sixth program states P4 to P6 may be set to 010, 100, and 001 in the order of LSB, CSB, and MSB. The variable data DATA_VR that corresponds to the seventh program state P7 may be set to 000 in the order of LSB, CSB, and MSB.

Assuming that the data combination with the largest number of data 1's is referred to as a first group and the data combination with the smallest number of data 1's is referred to as a second group, the matching of the states of the memory cells to the variable data DATA_VR may be variously changed in groups of data combinations other than the first and second groups. In other words, the matching of the states of the memory cells that are included in a group with the same number of data 1's to the variable data DATA_VR may be variously changed. Among these data combinations, a data combination that is different from the data combination that is shown in FIG. 9A will be described with reference to FIG. 9B.

Referring to FIG. 9B, as in the embodiment described with reference to FIG. 9A, the number of data 1's is set to three (3) in the erase state ER, the number of data 1's is set to two (2) in the first to third program states P1 to P3, the number of data 1's is set to one (1) in the fourth to sixth program states P4 to P6, and data 1 is not included in the seventh program state P7.

Among the groups with the same number of data 1's, in the remaining groups other than the group with the largest number of data 1's and the group with the smallest number of data 1's, the matching of the states P1 to P3 and P4 to P6 of the memory cells to the variable data DATA_VR may be changed in various combinations. For instance, the variable data DATA_VR that corresponds to the erase state ER may be set to 111 in the order of LSB, CSB, and MSB. The variable data DATA_VR that corresponds to the first to third program states P1 to P3 may be set to 011, 101, and 110 in the order of LSB, CSB, and MSB. The variable data DATA_VR that corresponds to the fourth to sixth program states P4 to P6 may be set to 010, 001, and 100 in the order of LSB, CSB, and MSB. The variable data DATA_VR that corresponds to the seventh program state P7 may be set to 000 in the order of LSB, CSB, and MSB.

In the triple level cell method, since three pieces of logic page data LSB, CSB, and MSB are used, the combination of the variable data DATA_VR that may be generated according to the present embodiment may be variously changed as shown in Table 1 to Table 36 below.

TABLE 1

|     | ER | P1 | P2 | P3 | P4 | P5 | P6 | P7 |
|-----|----|----|----|----|----|----|----|----|
| LSB | 1  | 1  | 1  | 0  | 0  | 1  | 0  | 0  |
| CSB | 1  | 1  | 0  | 1  | 1  | 0  | 0  | 0  |
| MSB | 1  | 0  | 1  | 1  | 0  | 0  | 1  | 0  |

TABLE 2

|     | ER | P1 | P2 | P3 | P4 | P5 | P6 | P7 |
|-----|----|----|----|----|----|----|----|----|
| LSB | 1  | 1  | 1  | 0  | 1  | 0  | 0  | 0  |
| CSB | 1  | 1  | 0  | 1  | 0  | 1  | 0  | 0  |
| MSB | 1  | 0  | 1  | 1  | 0  | 0  | 1  | 0  |

TABLE 3

|     | ER | P1 | P2 | P3 | P4 | P5 | P6 | P7 |
|-----|----|----|----|----|----|----|----|----|
| LSB | 1  | 1  | 1  | 0  | 1  | 0  | 0  | 0  |
| CSB | 1  | 1  | 0  | 1  | 0  | 0  | 1  | 0  |
| MSB | 1  | 0  | 1  | 1  | 0  | 1  | 0  | 0  |

TABLE 4

|     | ER | P1 | P2 | P3 | P4 | P5 | P6 | P7 |
|-----|----|----|----|----|----|----|----|----|
| LSB | 1  | 1  | 1  | 0  | 0  | 1  | 0  | 0  |
| CSB | 1  | 1  | 0  | 1  | 0  | 0  | 1  | 0  |
| MSB | 1  | 0  | 1  | 1  | 1  | 0  | 0  | 0  |

TABLE 5

|     | ER | P1 | P2 | P3 | P4 | P5 | P6 | P7 |
|-----|----|----|----|----|----|----|----|----|
| LSB | 1  | 1  | 1  | 0  | 0  | 0  | 1  | 0  |
| CSB | 1  | 1  | 0  | 1  | 1  | 0  | 0  | 0  |
| MSB | 1  | 0  | 1  | 1  | 0  | 1  | 0  | 0  |

TABLE 6

|     | ER | P1 | P2 | P3 | P4 | P5 | P6 | P7 |
|-----|----|----|----|----|----|----|----|----|
| LSB | 1  | 1  | 1  | 0  | 0  | 0  | 1  | 0  |
| CSB | 1  | 1  | 0  | 1  | 0  | 1  | 0  | 0  |
| MSB | 1  | 0  | 1  | 1  | 1  | 0  | 0  | 0  |

TABLE 7

|     | ER | P1 | P2 | P3 | P4 | P5 | P6 | P7 |
|-----|----|----|----|----|----|----|----|----|
| LSB | 1  | 0  | 1  | 1  | 0  | 1  | 0  | 0  |
| CSB | 1  | 1  | 0  | 1  | 1  | 0  | 0  | 0  |
| MSB | 1  | 1  | 1  | 0  | 0  | 0  | 1  | 0  |

TABLE 8

|     | ER | P1 | P2 | P3 | P4 | P5 | P6 | P7 |
|-----|----|----|----|----|----|----|----|----|
| LSB | 1  | 0  | 1  | 1  | 1  | 0  | 0  | 0  |
| CSB | 1  | 1  | 0  | 1  | 0  | 1  | 0  | 0  |
| MSB | 1  | 1  | 1  | 0  | 0  | 0  | 1  | 0  |

TABLE 9

|     | ER | P1 | P2 | P3 | P4 | P5 | P6 | P7 |
|-----|----|----|----|----|----|----|----|----|
| LSB | 1  | 0  | 1  | 1  | 1  | 0  | 0  | 0  |
| CSB | 1  | 1  | 0  | 1  | 0  | 0  | 1  | 0  |
| MSB | 1  | 1  | 1  | 0  | 0  | 1  | 0  | 0  |

TABLE 10

|     | ER | P1 | P2 | P3 | P4 | P5 | P6 | P7 |
|-----|----|----|----|----|----|----|----|----|
| LSB | 1  | 0  | 1  | 1  | 0  | 1  | 0  | 0  |
| CSB | 1  | 1  | 0  | 1  | 0  | 0  | 1  | 0  |
| MSB | 1  | 1  | 1  | 0  | 1  | 0  | 0  | 0  |

TABLE 11

|     | ER | P1 | P2 | P3 | P4 | P5 | P6 | P7 |
|-----|----|----|----|----|----|----|----|----|
| LSB | 1  | 0  | 1  | 1  | 0  | 0  | 1  | 0  |
| CSB | 1  | 1  | 0  | 1  | 1  | 0  | 0  | 0  |
| MSB | 1  | 1  | 1  | 0  | 0  | 1  | 0  | 0  |

TABLE 12

|     | ER | P1 | P2 | P3 | P4 | P5 | P6 | P7 |
|-----|----|----|----|----|----|----|----|----|
| LSB | 1  | 0  | 1  | 1  | 0  | 0  | 1  | 0  |
| CSB | 1  | 1  | 0  | 1  | 0  | 1  | 0  | 0  |
| MSB | 1  | 1  | 1  | 0  | 1  | 0  | 0  | 0  |

TABLE 13

|     | ER | P1 | P2 | P3 | P4 | P5 | P6 | P7 |
|-----|----|----|----|----|----|----|----|----|
| LSB | 1  | 1  | 1  | 0  | 0  | 1  | 0  | 0  |
| CSB | 1  | 0  | 1  | 1  | 1  | 0  | 0  | 0  |
| MSB | 1  | 1  | 0  | 1  | 0  | 0  | 1  | 0  |

TABLE 14

|     | ER | P1 | P2 | P3 | P4 | P5 | P6 | P7 |
|-----|----|----|----|----|----|----|----|----|
| LSB | 1  | 1  | 1  | 0  | 1  | 0  | 0  | 0  |
| CSB | 1  | 0  | 1  | 1  | 0  | 1  | 0  | 0  |
| MSB | 1  | 1  | 0  | 1  | 0  | 0  | 1  | 0  |

TABLE 15

|     | ER | P1 | P2 | P3 | P4 | P5 | P6 | P7 |
|-----|----|----|----|----|----|----|----|----|
| LSB | 1  | 1  | 1  | 0  | 1  | 0  | 0  | 0  |
| CSB | 1  | 0  | 1  | 1  | 0  | 0  | 1  | 0  |
| MSB | 1  | 1  | 0  | 1  | 0  | 1  | 0  | 0  |

TABLE 16

|     | ER | P1 | P2 | P3 | P4 | P5 | P6 | P7 |
|-----|----|----|----|----|----|----|----|----|
| LSB | 1  | 1  | 1  | 0  | 0  | 1  | 0  | 0  |
| CSB | 1  | 0  | 1  | 1  | 0  | 0  | 1  | 0  |
| MSB | 1  | 1  | 0  | 1  | 1  | 0  | 0  | 0  |

TABLE 17

|     | ER | P1 | P2 | P3 | P4 | P5 | P6 | P7 |
|-----|----|----|----|----|----|----|----|----|
| LSB | 1  | 1  | 1  | 0  | 0  | 1  | 0  | 0  |
| CSB | 1  | 0  | 1  | 1  | 1  | 0  | 0  | 0  |
| MSB | 1  | 1  | 0  | 1  | 0  | 1  | 0  | 0  |

TABLE 18

|     | ER | P1 | P2 | P3 | P4 | P5 | P6 | P7 |
|-----|----|----|----|----|----|----|----|----|
| LSB | 1  | 1  | 1  | 0  | 0  | 1  | 0  | 0  |
| CSB | 1  | 0  | 1  | 1  | 0  | 1  | 0  | 0  |
| MSB | 1  | 1  | 0  | 1  | 1  | 0  | 0  | 0  |

TABLE 19

|     | ER | P1 | P2 | P3 | P4 | P5 | P6 | P7 |
|-----|----|----|----|----|----|----|----|----|
| LSB | 1  | 1  | 0  | 1  | 0  | 1  | 0  | 0  |
| CSB | 1  | 0  | 1  | 1  | 1  | 0  | 0  | 0  |
| MSB | 1  | 1  | 1  | 0  | 0  | 0  | 1  | 0  |

TABLE 20

|     | ER | P1 | P2 | P3 | P4 | P5 | P6 | P7 |
|-----|----|----|----|----|----|----|----|----|
| LSB | 1  | 1  | 0  | 1  | 1  | 0  | 0  | 0  |
| CSB | 1  | 0  | 1  | 1  | 0  | 1  | 0  | 0  |
| MSB | 1  | 1  | 1  | 0  | 0  | 0  | 1  | 0  |

TABLE 21

|     | ER | P1 | P2 | P3 | P4 | P5 | P6 | P7 |
|-----|----|----|----|----|----|----|----|----|
| LSB | 1  | 1  | 1  | 0  | 1  | 0  | 0  | 0  |
| CSB | 1  | 0  | 1  | 1  | 0  | 0  | 1  | 0  |
| MSB | 1  | 1  | 1  | 0  | 0  | 1  | 0  | 0  |

TABLE 22

|     | ER | P1 | P2 | P3 | P4 | P5 | P6 | P7 |
|-----|----|----|----|----|----|----|----|----|
| LSB | 1  | 1  | 0  | 1  | 0  | 1  | 0  | 0  |
| CSB | 1  | 0  | 1  | 1  | 0  | 0  | 1  | 0  |
| MSB | 1  | 1  | 1  | 0  | 1  | 0  | 0  | 0  |

TABLE 23

|     | ER | P1 | P2 | P3 | P4 | P5 | P6 | P7 |
|-----|----|----|----|----|----|----|----|----|
| LSB | 1  | 1  | 0  | 1  | 0  | 0  | 1  | 0  |
| CSB | 1  | 0  | 1  | 1  | 1  | 0  | 0  | 0  |
| MSB | 1  | 1  | 1  | 0  | 0  | 1  | 0  | 0  |

TABLE 24

|     | ER | P1 | P2 | P3 | P4 | P5 | P6 | P7 |
|-----|----|----|----|----|----|----|----|----|
| LSB | 1  | 1  | 0  | 1  | 0  | 0  | 1  | 0  |
| CSB | 1  | 0  | 1  | 1  | 0  | 1  | 0  | 0  |
| MSB | 1  | 1  | 1  | 0  | 1  | 0  | 0  | 0  |

TABLE 25

|     | ER | P1 | P2 | P3 | P4 | P5 | P6 | P7 |
|-----|----|----|----|----|----|----|----|----|
| LSB | 1  | 0  | 1  | 1  | 0  | 1  | 0  | 0  |
| CSB | 1  | 1  | 1  | 0  | 1  | 0  | 0  | 0  |
| MSB | 1  | 1  | 0  | 1  | 0  | 0  | 1  | 0  |

TABLE 26

|     | ER | P1 | P2 | P3 | P4 | P5 | P6 | P7 |
|-----|----|----|----|----|----|----|----|----|
| LSB | 1  | 0  | 1  | 1  | 1  | 0  | 0  | 0  |
| CSB | 1  | 1  | 1  | 0  | 0  | 1  | 0  | 0  |
| MSB | 1  | 1  | 0  | 1  | 0  | 0  | 1  | 0  |

TABLE 27

|     | ER | P1 | P2 | P3 | P4 | P5 | P6 | P7 |
|-----|----|----|----|----|----|----|----|----|
| LSB | 1  | 0  | 1  | 1  | 1  | 0  | 0  | 0  |
| CSB | 1  | 1  | 1  | 0  | 0  | 0  | 1  | 0  |
| MSB | 1  | 1  | 0  | 1  | 0  | 1  | 0  | 0  |

TABLE 28

|     | ER | P1 | P2 | P3 | P4 | P5 | P6 | P7 |
|-----|----|----|----|----|----|----|----|----|
| LSB | 1  | 0  | 1  | 1  | 0  | 1  | 0  | 0  |
| CSB | 1  | 1  | 1  | 0  | 0  | 0  | 1  | 0  |
| MSB | 1  | 1  | 0  | 1  | 1  | 0  | 0  | 0  |

TABLE 29

|     | ER | P1 | P2 | P3 | P4 | P5 | P6 | P7 |
|-----|----|----|----|----|----|----|----|----|
| LSB | 1  | 0  | 1  | 1  | 0  | 0  | 1  | 0  |
| CSB | 1  | 1  | 1  | 0  | 1  | 0  | 0  | 0  |
| MSB | 1  | 1  | 0  | 1  | 0  | 1  | 0  | 0  |

TABLE 30

|     | ER | P1 | P2 | P3 | P4 | P5 | P6 | P7 |
|-----|----|----|----|----|----|----|----|----|
| LSB | 1  | 0  | 1  | 1  | 0  | 0  | 1  | 0  |
| CSB | 1  | 1  | 1  | 0  | 0  | 1  | 0  | 0  |
| MSB | 1  | 1  | 0  | 1  | 1  | 0  | 0  | 0  |

TABLE 31

|     | ER | P1 | P2 | P3 | P4 | P5 | P6 | P7 |
|-----|----|----|----|----|----|----|----|----|
| LSB | 1  | 1  | 0  | 1  | 0  | 1  | 0  | 0  |
| CSB | 1  | 1  | 1  | 0  | 1  | 0  | 0  | 0  |
| MSB | 1  | 0  | 1  | 1  | 0  | 0  | 1  | 0  |

TABLE 32

|     | ER | P1 | P2 | P3 | P4 | P5 | P6 | P7 |
|-----|----|----|----|----|----|----|----|----|
| LSB | 1  | 1  | 0  | 1  | 1  | 0  | 0  | 0  |
| CSB | 1  | 1  | 1  | 0  | 0  | 1  | 0  | 0  |
| MSB | 1  | 0  | 1  | 1  | 0  | 0  | 1  | 0  |

TABLE 33

|     | ER | P1 | P2 | P3 | P4 | P5 | P6 | P7 |
|-----|----|----|----|----|----|----|----|----|
| LSB | 1  | 1  | 0  | 1  | 1  | 0  | 0  | 0  |
| CSB | 1  | 1  | 1  | 0  | 0  | 0  | 1  | 0  |
| MSB | 1  | 0  | 1  | 1  | 0  | 1  | 0  | 0  |

TABLE 34

|     | ER | P1 | P2 | P3 | P4 | P5 | P6 | P7 |
|-----|----|----|----|----|----|----|----|----|
| LSB | 1  | 1  | 0  | 1  | 0  | 1  | 0  | 0  |
| CSB | 1  | 1  | 1  | 0  | 0  | 0  | 1  | 0  |
| MSB | 1  | 0  | 1  | 1  | 1  | 0  | 0  | 0  |

TABLE 35

|     | ER | P1 | P2 | P3 | P4 | P5 | P6 | P7 |
|-----|----|----|----|----|----|----|----|----|
| LSB | 1  | 1  | 0  | 1  | 0  | 0  | 1  | 0  |
| CSB | 1  | 1  | 1  | 0  | 1  | 0  | 0  | 0  |
| MSB | 1  | 0  | 1  | 1  | 0  | 1  | 0  | 0  |

TABLE 36

|     | ER | P1 | P2 | P3 | P4 | P5 | P6 | P7 |
|-----|----|----|----|----|----|----|----|----|
| LSB | 1  | 1  | 0  | 1  | 0  | 0  | 1  | 0  |
| CSB | 1  | 1  | 1  | 0  | 0  | 1  | 0  | 0  |
| MSB | 1  | 0  | 1  | 1  | 1  | 0  | 0  | 0  |

Referring to Table 1 to Table 36, it can be seen that all of the variable data DATA_VR that matches the erase state ER with the lowest threshold voltage are fixed to 111, and all of the variable data DATA_VR that matches the seventh program state P7 with the highest threshold voltage are fixed to 000. Further, it can be seen that the number of data 1's is two in the variable data DATA_VR that matches the first to third program states P1 to P3, and the number of data 1's is one in the variable data DATA_VR that matches the fourth to sixth program states P4 to P6.

Figure 10:
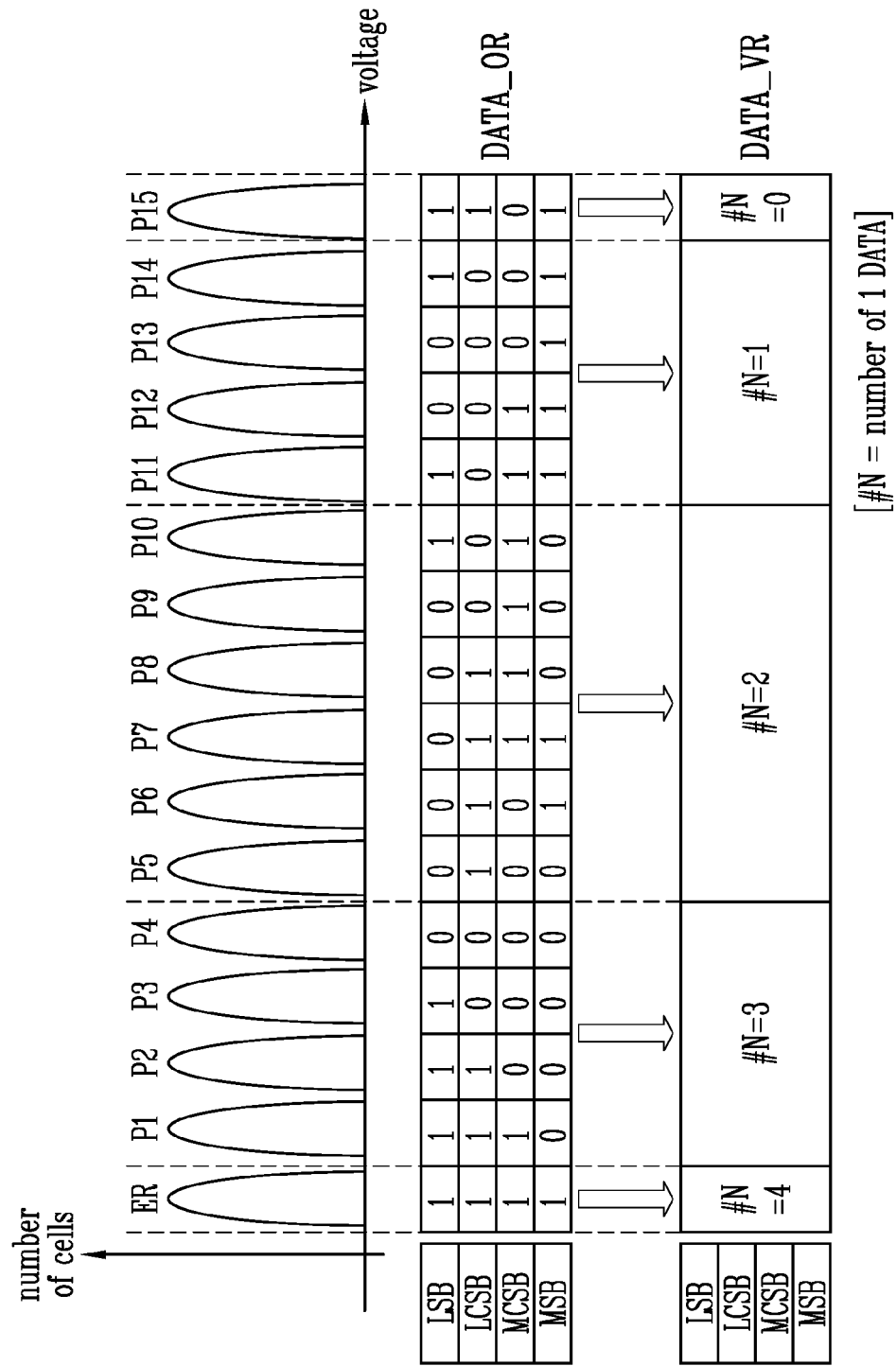
FIG. 10 is a diagram illustrating a data conversion method in accordance with a second embodiment of the present disclosure.

FIG. 10 is a diagram illustrating a data conversion method in accordance with a second embodiment of the present disclosure, in which the quadruple level cell method is shown as the second embodiment.

Referring to FIG. 10, in the quadruple level cell method, the state of memory cells may be divided into one erase state ER and first to 15-th program states P1 to P15. In the erase state ER, the threshold voltage of the memory cells may be the lowest. From the first program state P1 to the 15-th program state P15, the memory cells may have threshold voltages increased in stages. The state of the memory cells may be determined according to the combination of least significant bit (LSB) data, first central significant bit (LCSB) data, second central significant bit (MCSB) data, and most significant bit (MSB) data. For instance, in the original data DATA_OR, the erase state ER may be set to least significant bit (LSB) data of 1, central significant bit (CSB) data of 1, and most significant bit (MSB) data of 1. If the original data DATA_OR that is set in each of the first to 15-th program states P1 to P15 is arranged in the order of LSB, LCSB, MCSB, and MSB, it may be 1100, 1110, 1100, 1000, 0000, 0100, 0101, 0111, 0110, 0010, 1010, 1011, 0011, 0001, 1001, and 1101. The original data DATA_OR shown in FIG. 10 may have any set pattern to help understand the present embodiment, and may be set to various patterns in addition to the pattern that is shown in FIG. 10.

However, since the original data DATA_OR that corresponds to each of the erase state ER and the first to 15-th program states P1 to P15 is not set in a predetermined pattern, a large number of latches may be required for each of the page buffers to perform the program operation by using the original data DATA_OR.

Therefore, according to this embodiment, in order to minimize the number of latches that are included in the page buffer, the original data DATA_OR may be converted into variable data DATA_VR with a given rule. The operation of converting the original data DATA_OR into the variable data DATA_VR may be performed by the data pattern manager 310, illustrated in FIG. 2. Although FIG. 2 illustrates that the data pattern manager 310 is included in the control logic circuit 300 (see FIG. 2), the data pattern manager may be independently disposed outside of the control logic circuit 300 (see FIG. 2).

According to the given rule of this embodiment, the combination of the LSB data, the LCSB data, the MCSB data, and the MSB data may be divided into a plurality of groups according to the number of specific data, and states of memory cells may correspond to different data combinations that are included in each group. For instance, the erase state ER may be set to the data combination of LSB, LCSB, MCSB, and MSB in which the number (#N) of data 1's is four (4), the first to fourth program states P1 to P4 may be set to the data combinations of LSB, LCSB, MCSB, and MSB in which the number (#N) of data 1's is three (3), the fifth to tenth program states P5 to P10 may be set to the data combinations of LSB, LCSB, MCSB, and MSB in which the number (#N) of data 1's is two (2), the 11-th to 14-th program states P11 to P14 may be set to the data combinations of LSB, LCSB, MCSB, and MSB in which the number (#N) of data 1's is one (1), and the 15-th program state P15 may be set to the data combination of LSB, LCSB, MCSB, and MSB in which the number (#N) of data 1's is zero (0).

That is, in the original data DATA_OR, the number (#N) of data 1's included in the data combinations of LSB, LCSB, MCSB, and MSB of the first to fourth program states P1 to P4 is 3, 2, 1, and 0, the number (#N) of data 1's included in the data combinations of LSB, LCSB, MCSB, and MSB of the fifth to tenth program states P5 to P10 is 1, 2, 3, 2, and 1, the number (#N) of data 1's included in the data combinations of LSB, LCSB, MCSB, and MSB of the 11-th to 14-th program states P11 to P14 is 3, 2, 1, and 2, and the number (#N) of data 1's included in the data combination of LSB, LCSB, MCSB, and MSB of the 15-th program state P15 is 3. Thus, there is no given rule.

However, the variable data DATA_VR that is converted according to the present embodiment may be set by a given rule in which the data combination that corresponds to the erase state ER to the 15-th program state P15 is divided according to the number of data 1's. The variable data DATA_VR, in accordance with the second embodiment, will be described below in detail.

Figure 11A:
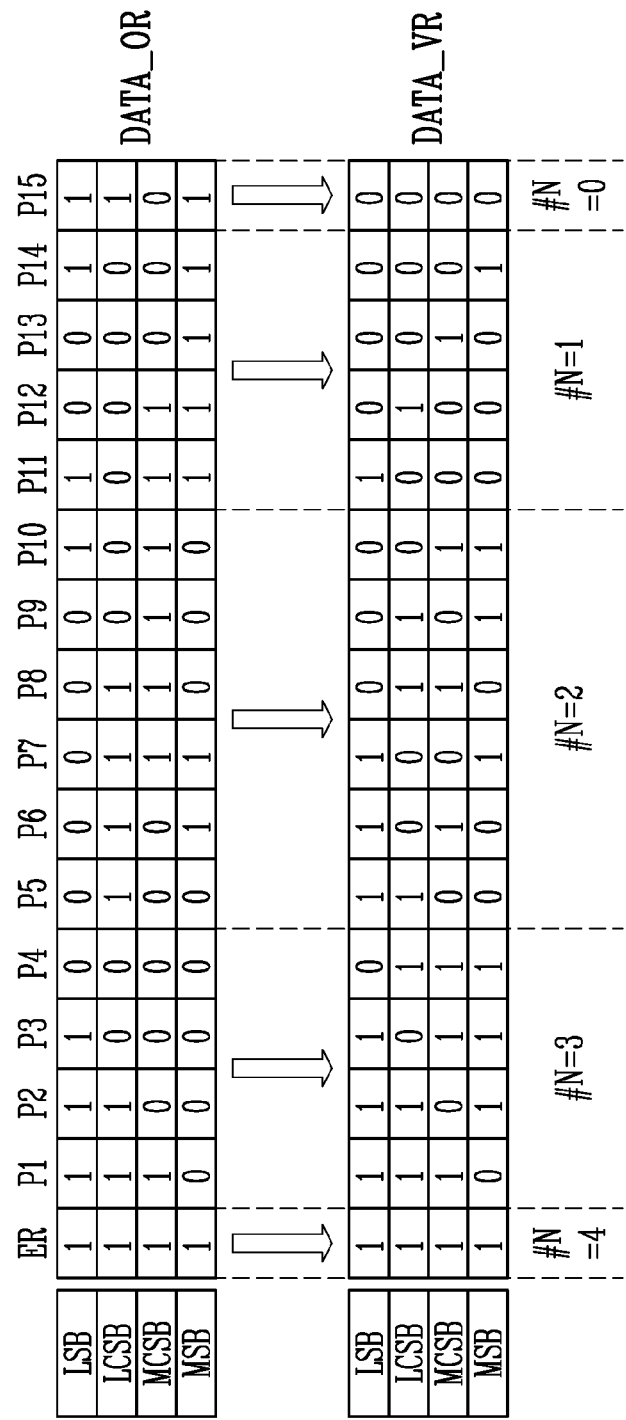
FIGS. 11A and 11B are diagrams illustrating various embodiments of converted data in accordance with the second embodiment of the present disclosure.
Figure 11B:
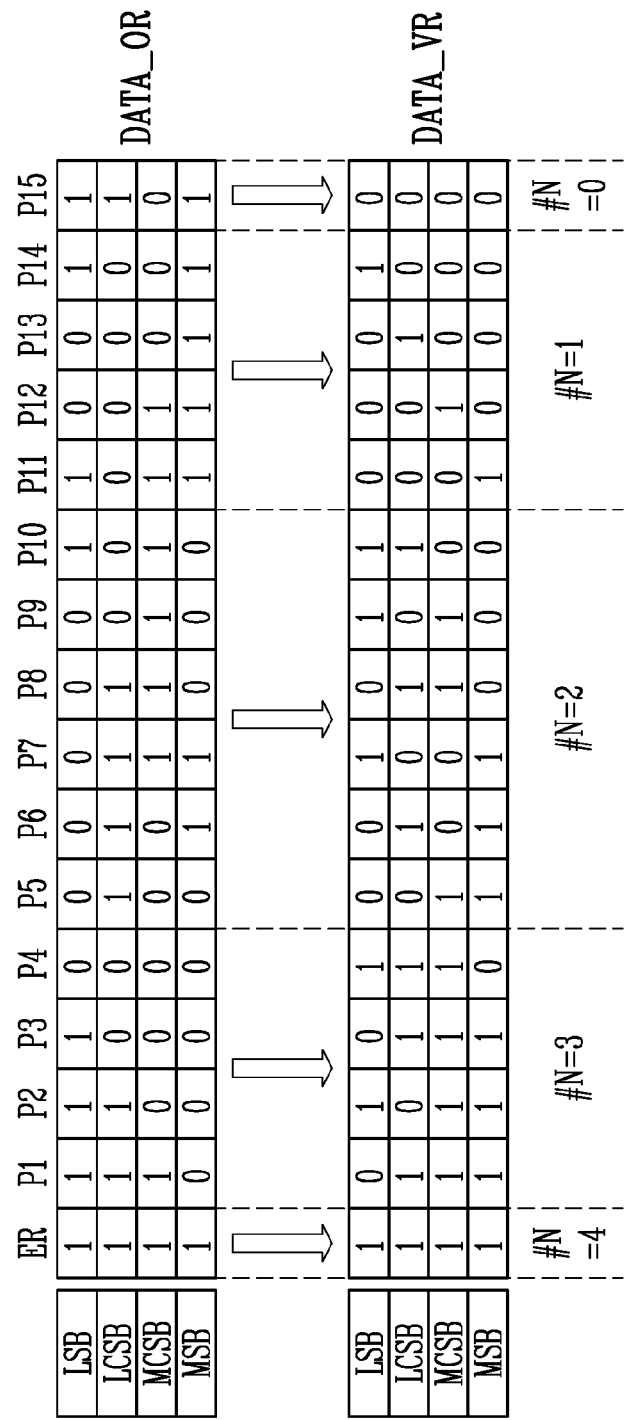

FIGS. 11A and 11B are diagrams illustrating various embodiments of converted data in accordance with the second embodiment of the present disclosure.

Referring to FIG. 11A, the erase state ER with the lowest threshold voltage may be set to the data combination of LSB, LCSB, MCSB, and MSB in which the number (#N) of data 1's is four (4), the first to fourth program states P1 to P4 may be set to the data combinations of LSB, LCSB, MCSB, and MSB in which the number (#N) of data 1's is three (3), the fifth to tenth program states P5 to P10 may be set to the data combinations of LSB, LCSB, MCSB, and MSB in which the number (#N) of data 1's is two (2), the 11-th to 14-th program states P11 to P14 may be set to the data combinations of LSB, LCSB, MCSB, and MSB in which the number (#N) of data 1's is one (1), and the 15-th program state P15 with the highest threshold voltage may be set to the data combination of LSB, LCSB, MCSB, and MSB in which the number (#N) of data 1's is zero (0).

For instance, the variable data DATA_VR that corresponds to the erase state ER may be set to 1111 in the order of LSB, LCSB, MCSB, and MSB. The variable data DATA_VR that corresponds to the first to fourth program states P1 to P4 may be set to 1110, 1101, 1011, and 0111 in the order of LSB, LCSB, MCSB, and MSB, the variable data DATA_VR that corresponds to the fifth to tenth program states P5 to PA10 may be set to 1100, 1010, 1001, 0110, 0101 and 0011 in the order of LSB, LCSB, MCSB, and MSB, and the variable data DATA_VR that corresponds to the 11-th to 14-th program states P11 to P14 may be set to 1000, 0100, 0010, and 0001 in the order of LSB, LCSB, MCSB, and MSB. The variable data DATA_VR that corresponds to the 15-th program state P15 may be set to 0000 in the order of LSB, LCSB, MCSB, and MSB.

Assuming that the data combination with the largest number of data 1's is referred to as a first group and the data combination with the smallest number of data 1's is referred to as a second group, the matching of the states of the memory cells to the variable data DATA_VR may be variously changed in groups of data combinations other than the first and second groups. In other words, the matching of the states of the memory cells that are included in a group with the same number of data 1's to the variable data DATA_VR may be variously changed. Among these data combinations, a data combination that is different from the data combination that is shown in FIG. 11A will be described with reference to FIG. 11B.

Referring to FIG. 11B, as in the embodiment described with reference to FIG. 11A, the number of data 1's is set to four (4) in the erase state ER, the number of data 1's is set to three (3) in the first to fourth program states P1 to P4, the number of data 1's is set to two (2) in the fifth to tenth program states P5 to P10, the number of data 1's is set to one (1) in the 11-th to 14-th program states P11 to P14, and data 1 is not included in the 15-th program state P15 (#N=0).

Among the groups with the same number of data 1's, in the remaining groups other than the group with the largest number of data 1's and the group with the smallest number of data 1's, the matching of the program states P1 to P4, P5 to P10, and P11 to P14 of the memory cells to the variable data DATA_VR may be changed in various combinations. For instance, the variable data DATA_VR that corresponds to the erase state ER may be set to 1111 in the order of LSB, LCSB, MCSB, and MSB. The variable data DATA_VR that corresponds to the first to fourth program states P1 to P4 may be set to 0111, 1011, 0111, and 1110 in the order of LSB, LCSB, MCSB, and MSB, the variable data DATA_VR that corresponds to the fifth to tenth program states P5 to PA10 may be set to 0011, 0101, 1001, 0110, 1010, and 1100 in the order of LSB, LCSB, MCSB, and MSB, and the variable data DATA_VR that corresponds to the 11-th to 14-th program states P11 to P14 may be set to 0001, 0010, 0100, and 1000 in the order of LSB, LCSB, MCSB, and MSB. The variable data DATA_VR that corresponds to the 15-th program state P15 may be set to 0000 in the order of LSB, LCSB, MCSB, and MSB.

In the present embodiment, the method of converting the original data DATA_OR into the variable data DATA_VR in the triple level cell method and the quadruple level cell method has been disclosed, but the present disclosure is not limited thereto. Higher level cell methods may utilize the same rules and may be set according to the number of specific data. The combination of program states and variable data DATA_VR may also be variously changed within the same group.

Figure 12:
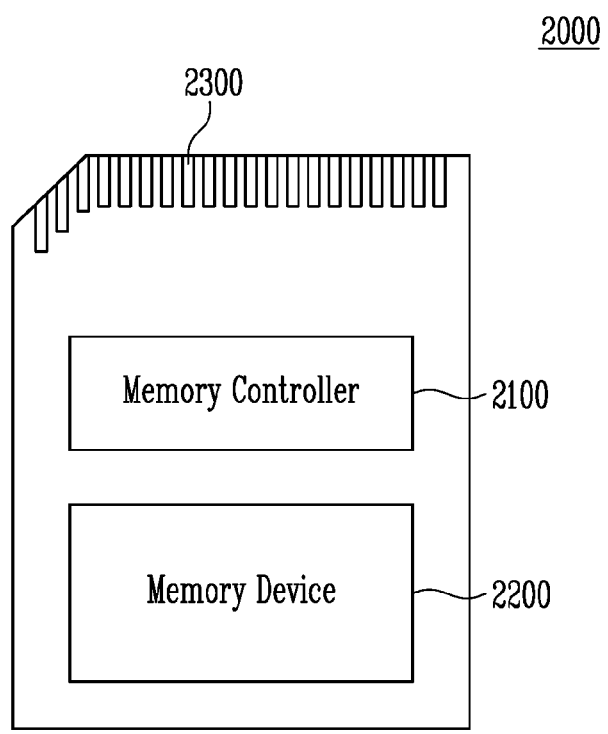
FIG. 12 is a diagram illustrating a memory card system to which the memory device of the present disclosure is applied.

FIG. 12 is a diagram illustrating a memory card system to which the memory device of the present disclosure is applied.

Referring FIG. 12, the memory card system 2000 may include a memory controller 2100, a memory device 2200, and a connector 2300.

The memory controller 2100 may be connected to the memory device 2200. The memory controller 2100 may be configured to access the memory device 2200. For example, the memory controller 2100 may be configured to control a program operation, a read operation, or an erase operation, or configured to control a background operation of the memory device 2200. The memory controller 2100 may provide an interface between the memory device 2200 and the host. The memory controller 2100 may drive firmware that controls the memory device 2200. The memory device 2200 may be embodied in the same manner as the memory device MD that is described with reference to FIG. 2.

The memory controller 2100 may communicate with an external device through the connector 2300. The memory controller 2100 may communicate with the external device (e.g., a host) based on a specific communication protocol. In an embodiment, the memory controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA, parallel-ATA, small computer system interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an electrically erasable and programmable ROM (EEPROM), a NAND flash memory, a NOR flash memory, a phase-change RAM (PRAM), a resistive RAM (ReRAM), a ferroelectric RAM (FRAM), and a spin transfer torque-magnetic RAM (STT-MRAM).

In an embodiment, the memory controller 2100 and the memory device 2200 may be integrated into a single semiconductor device to form a memory card. For example, the memory controller 2100 and the memory device 2200 may be integrated into a single semiconductor device to form a memory card, such as a personal computer memory card international association (PCMCIA), a compact flash card (CF), a smart media card (SM or SMC), a memory stick, a multimedia card (MMC, RS-MMC, MMC micro, eMMC), a SD card (SD, mini SD, micro SD, or SDHC), or a universal flash storage (UFS).

Figure 13:
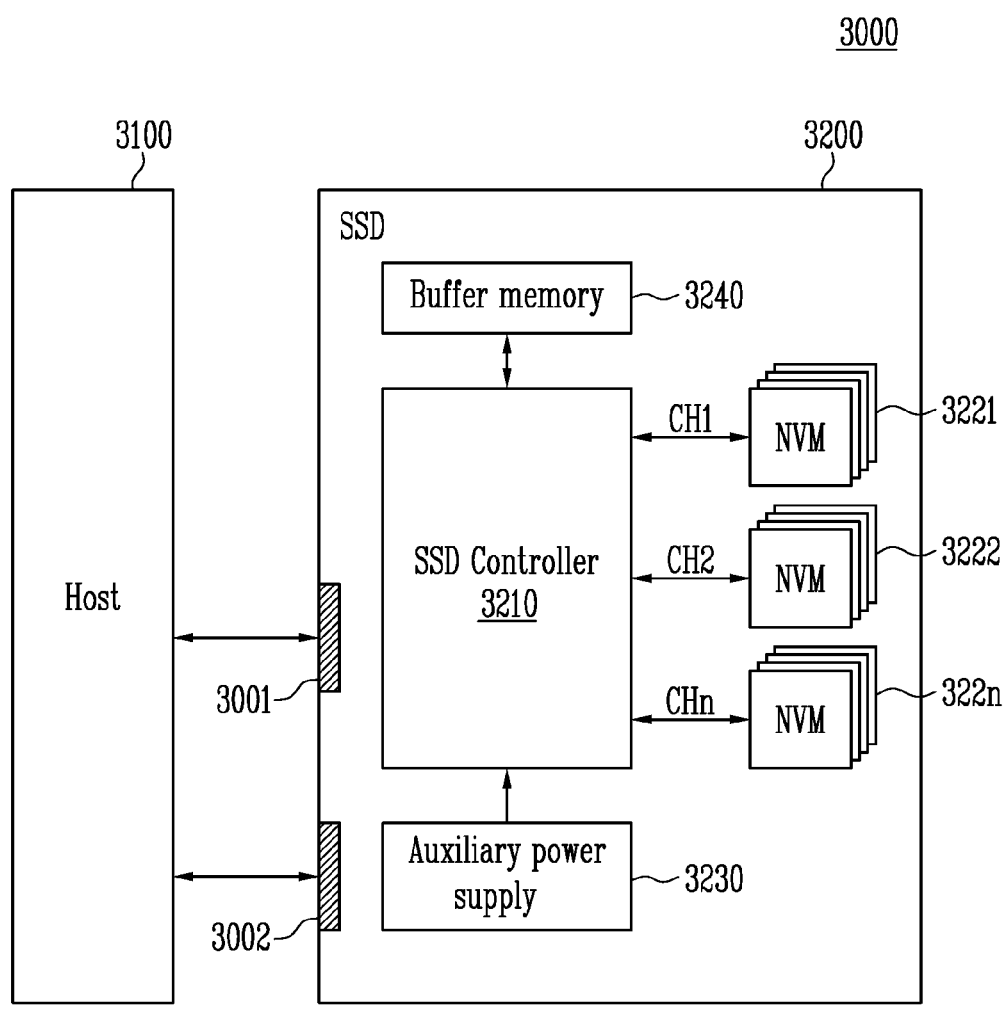
FIG. 13 is a diagram illustrating a Solid State Drive (SSD) system to which the memory device of the present disclosure is applied.

FIG. 13 is a diagram illustrating a Solid State Drive (SSD) system to which the memory device of the present disclosure is applied Referring to FIG. 13, the SSD system 3000 may include a host 3100 and an SSD 3200. The SSD 3200 may exchange signals with the host 3100 through a signal connector 3001 and may receive a supply voltage through a power connector 3002. The SSD 3200 may include an SSD controller 3210, a plurality of flash memories 3221 to 322n, an auxiliary power supply 3230, and a buffer memory 3240.

According to an embodiment of the present disclosure, the flash memories 3221 to 322n may have the same configuration as the memory device MD described with reference to FIG. 2.

The SSD controller 3210 may control the plurality of flash memories 3221 to 322n in response to the signals received from the host 3100. In an embodiment, the signals may be signals based on an interface between the host 3100 and the SSD 3200. For example, the signals may be signals defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be connected to the host 3100 through the power connector 3002. The auxiliary power supply 3230 may be supplied with power from the host 3100, and may be charged by the power. The auxiliary power supply 3230 may supply the power of the SSD 3200 when the supply of power from the host 3100 is not smoothly performed. In an embodiment, the auxiliary power supply 3230 may be positioned inside of the SSD 3200 or positioned outside of the SSD 3200. For example, the auxiliary power supply 3230 may be disposed in a main board and may supply auxiliary power to the SSD 3200.

The buffer memory 3240 may function as a buffer memory of the SSD 3200. For example, the buffer memory 3240 may temporarily store data that is received from the host 3100 or data that is received from the plurality of flash memories 3221 to 322n or may temporarily store metadata (e.g., a mapping table) of the flash memories 3221 to 322n. The buffer memory 3240 may include volatile memories, such as a DRAM, an SDRAM, a DDR SDRAM, and an LPDDR SDRAM or nonvolatile memories such as an FRAM, a ReRAM, an STT-MRAM, and a PRAM.

According to the present disclosure, it is possible to reduce the size of a memory device and to prevent a decrease in program operation speed due to the reduction in size.

What is claimed is:

1. A memory device comprising:
    a memory block with memory cells to which word lines and bit lines are connected;
    page buffers, connected to the memory block through the bit lines, during a program operation, configured to convert original data that is received from an external device into variable data with a plurality of data combinations that are divided into a plurality of groups according to a number of first level bits; and
    a data pattern manager configured to control the page buffers to convert the original data into the variable data so that the number of the first level bits of data combinations included in each of the groups among the plurality of data combinations is the same during the program operation.

2. The memory device according to claim 1, wherein each of the page buffers comprises a plurality of latches configured to store the original data or the variable data.

3. The memory device according to claim 2, wherein the data pattern manager is configured to output page buffer control signals that control the page buffers to convert the original data that is stored in the latches into the variable data.

4. The memory device according to claim 1,
wherein each of the original data and the variable data comprises the first level bits or second level bits of 3 or more bits.

5. The memory device according to claim 1, wherein, among the plurality of data combinations,
a first data combination with the largest number of the first level bits matches an erase state in which a threshold voltage of the memory cells is the lowest, and
a second data combination with the smallest number of the first level bits matches a program state in which the threshold voltage is highest.

6. The memory device according to claim 5, wherein, among the plurality of data combinations, third data combinations, respectively, which are divided in an order of varying threshold voltages match remaining program states other than the erase state and the program state in which the threshold voltage is highest.

7. The memory device according to claim 6, wherein the data pattern manager is configured to change the matching of the program states to the third data combinations within a group with the same number of the first level bits.

8. A memory device comprising:
a page buffer with a plurality of latches, the page buffer configured to store first logic page data, second logic page data, and third logic page data in a portion of the plurality of latches, respectively; and
a data pattern manager configured to control the page buffer to convert original data into variable data by moving the first to third logic page data of the original data between the latches,
wherein, when the original data is converted into the variable data, the data pattern manager is configured to control the page buffer to generate the variable data with data a plurality of combinations that are divided into a plurality of groups according to a number of a first level bit included in the first to third logic page data, and
wherein the number of the first level bits of data combinations included in each of the plurality of the groups among the plurality of data combinations is the same.

9. The memory device according to claim 8, wherein the variable data is divided into:
a first group in which all of the first to third logic page data are the first level bit,
a second group in which the first level bit is two of the first to third logic page data,
a third group in which the first level bit is one of the first to third logic page data, and
a fourth group in which the first level bit is not included in the first to third logic page data.

10. The memory device according to claim 9, wherein, according to the variable data with the first to fourth groups, memory cells are maintained in an erase state or programmed to be in any one of first to seventh program states.

11. The memory device according to claim 10,
wherein the variable data of the first group matches the erase state,
wherein the variable data of the second group matches the first to third program states,
wherein the variable data of the third group matches the fourth to sixth program states, and
wherein the variable data of the fourth group matches the seventh program state.

12. The memory device according to claim 11, wherein the variable data that matches each of the first to third program states comprises different data combinations of the first to third logic page data including two pieces of the first level bit.

13. The memory device according to claim 11, wherein the variable data that matches each of the fourth to sixth program states comprises different data combinations of the first to third logic page data including one piece of the first level bit.

14. A memory device comprising:
memory cells programmed into various states according to a combination of N-bit data;
a peripheral circuit configured to receive original data to perform a program operation of the memory cells, and to convert the original data into variable data with a plurality of combinations that are divided into first to (N+1)-th groups according to a number of first level bits; and
a control logic circuit configured to control the peripheral circuit to convert the original data into the variable data so that the number of the first level bits of data combinations included in each of the first to (N+1)-th groups among the plurality of data combinations is the same, and configured to control the peripheral circuit to program the memory cells by using the variable data.

15. The memory device according to claim 14, wherein the control logic circuit is configured to:
set the first group with N pieces of the first level bit in the variable data to an erase state, and
set the (N+1)-th group with the first level bit in the variable data to a program state with a highest threshold voltage.

16. The memory device according to claim 15, wherein the control logic circuit is configured to set second to N-th groups that are included between the first group and the (N+1)-th group to program states that are included between the erase state and the program state with the highest threshold voltage.

17. The memory device according to claim 16, wherein the control logic circuit is configured to set data combinations that are included in a group with the same number of the first level bits to different program states, respectively.

18. The memory device according to claim 14,
wherein the peripheral circuit comprises page buffers connected through bit lines to the memory cells, temporarily storing the original data based on the control logic circuit, and configured to convert the original data into the variable data.

19. The memory device according to claim 18, wherein each of the page buffers comprises a plurality of latches configured to store the original data or the variable data.

* * * * *